United States Patent [19]

Osborne et al.

[11] 4,099,246
[45] Jul. 4, 1978

[54] CALCULATOR HAVING MERGED KEY CODES

[75] Inventors: Thomas E. Osborne, San Francisco; Richard Kent Stockwell, Palo Alto, both of Calif.

[73] Assignee: Hewlett-Packard Company, Palo Alto, Calif.

[21] Appl. No.: 425,341

[22] Filed: Dec. 17, 1973

[51] Int. Cl.² .............................................. G06F 13/00
[52] U.S. Cl. ................................. 364/709; 340/365 R
[58] Field of Search ............... 235/156, 159, 160, 164, 235/145; 340/365, 172.5; 364/709

[56] References Cited

U.S. PATENT DOCUMENTS

| | | | |
|---|---|---|---|
| 3,533,076 | 10/1970 | Perkins et al. | 340/172.5 |
| 3,588,841 | 6/1971 | Ragen | 340/172.5 |
| 3,760,171 | 9/1973 | Wang et al. | 235/156 |
| 3,762,637 | 10/1973 | Hernandez | 235/156 |
| 3,855,461 | 12/1974 | Stockwell | 235/156 |
| 3,863,060 | 1/1975 | Rode et al. | 235/156 |

*Primary Examiner*—Malcolm A. Morrison
*Assistant Examiner*—Errol A. Krass
*Attorney, Agent, or Firm*—Patrick J. Barrett

[57] ABSTRACT

A hand-held, programmable, electronic calculator is capable of performing a larger number of functions than the number of keys on its keyboard and has one or more prefix keys to allow one function key to initiate more than one function. Each key generates a unique key code when it is depressed, and the calculator may be programmed by storing a series of the key codes in a memory. Memory space can be saved by generating unique merged codes to represent the combination of a prefix key and a function key, and storing this single merged code rather than the two key codes.

8 Claims, 3 Drawing Figures

CALCULATOR HAVING MERGED KEY CODES

BACKGROUND OF THE INVENTION

Electronic calculators are currently available for producing a wide variety of mathematical and manipulative operations formerly performed only by larger computers. The development of these calculators has been due in large part to the development of large-scale integrated circuits which have enabled calculator designers to implement a large number of computing circuits into very small packages. With this reduction in size of calculator components, many hand-held electronic calculators that perform sophisticated mathematical functions have become available. The number of functions that can be performed by hand-held calculators is usually limited by the number of keys that can be conveniently placed on the keyboard, rather than the number of the functions that can be performed by the circuitry inside the calculator, since a keyboard must be sufficiently large for a human operator to conveniently actuate the keys. Some calculator designers have alleviated this problem by providing a shift or prefix key that enables one or more of the other keys on the keyboard to initiate more than one calculator function. Examples of such calculators are the Hewlett-Packard Models 45 and 80.

A number of electronic calculators available today not only have the ability to perform sophisticated mathematical operations but they are programmable as well, enabling the calculator user to store a program of manipulative operations for later utilization. Programmable calculators often store such programs as a sequence of coded instructions usually called words or key codes. The storage memory usually has a given number of fixed-length positions in which these key codes can be stored, and the complexity of the programs the calculator can execute is often limited by the length of the program storage memory.

The stored program in a hand-held, programmable, electronic calculator usually comprises a series of key codes in a memory that correspond to the sequence keys a user would depress if he were performing the program manually. If some of the steps in the program comprise functions that are accessed from the calculator keyboard by first using a prefix key, then the program will have to store the prefix instruction as well as the instruction for the mathematical operation. If the program includes a significant number of such functions requiring the use of the prefix key, then a significant amount of the program storage space may be used up with the prefix instructions.

SUMMARY OF THE INVENTION

It is an object of this invention to reduce the amount of storage space required in a programmable, electronic calculator by multi-key instructions.

In accordance with the preferred embodiment of the present invention means are provided for generating a single key code, herein called a merged code, for each of several functions requiring a prefix key and a function key to initiate the function. A portable, programmable, electronic calculator may have, for example, 35 keys on its keyboard. A unique key code in the form of a binary number is usually assigned to each key and thus a calculator having 35 keys requires a six-digit binary code to uniquely represent each key. However, six binary digits can represent up to 64 unique combinations and a calculator having only 35 keys thus has 29 spare or unused key codes. Some or all of these spare key codes can be used to represent those functions that are accessible from the keyboard only by first actuating a prefix key. When the calculator is being programmed, each key code is entered into the program memory after the corresponding key is depressed. When a prefix key is depressed, a flag is also set in a status register in the calculator. If the following key is one that may be both validly prefixed by and merged with the preceding key, the flag in the status register causes the calculator to replace the previously stored prefix key code by a merged key code representing both the prefix and the subsequently depressed key. The merged key codes thus save program memory space by storing only a single code representative of the desired operation.

DESCRIPTION OF THE PREFERRED EMBODIMENT

Figure 1:
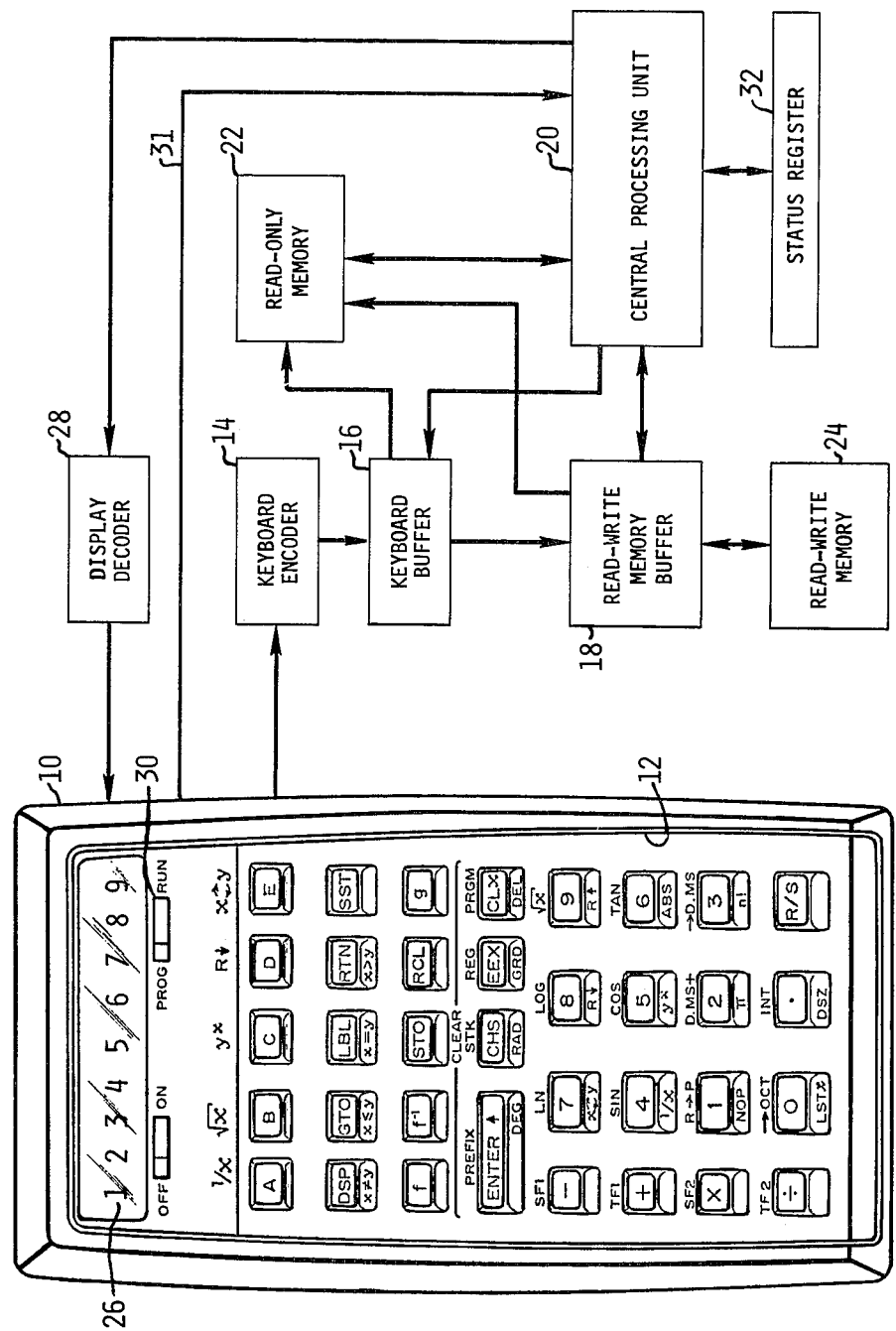
FIG. 1 shows a block diagram of a calculator according to the preferred embodiment.

FIG. 1 is a block diagram of a programmable, electronic calculator 10 having a keyboard 12 with keys for entering numbers and initiating the performance of various mathematical and manipulative operations. Keyboard 12 is connected to a keyboard encoder 14 which generates a binary code for each key that is depressed. Since keyboard 12 has 35 keys, a six-digit binary number is used to represent each of the keys. Illustrative examples of key codes, expressed in octal form, are shown in Table I. The keyboard and encoder may be implemented, for example, with an array of single-pole, single-throw switches, each switch being actuated by a key and being connected to a common diode encoding matrix or other wellknown encoding structure. A keyboard buffer 16, connected to keyboard encoder 14, is a six binary digit (bit) shift register that stores the most recently generated key code. Key codes are subsequently transferred from the keyboard buffer to other elements in the calculator. A read-only memory (ROM) 22 contains instructions in binary form for the performance of the various calculator functions and these instructions are addressed or initiated by the binary key codes. Central processing unit (CPU) 20 performs the mathematical and control operations programmed in ROM 22. Results of keyboard entries as well as the manipulative operations performed by CPU 20 are displayed in a display 26 connected to CPU 20 by display decoder 28. The operation of such a ROM and CPU along with a keyboard display and associated components is described in detail in a patent application by Francé Rodé, et al., entitled "Improved Business Calculator," Ser. No. 302,371, now U.S. Pat. No. 3,863,060 filed Oct. 30, 1972 and assigned to the assignee of the instant application, and also in the *Hewlett-Packard Journal*, June 1, 1971, pages 1 through 9.

Calculator 10 includes a read-write memory 24 that can store key codes from the keyboard, enabling the calculator to be programmed to perform mathematical and manipulative functions by storing key codes in the memory and initiating the recall of those stored key codes from the memory. Keyboard buffer 16 is connected to a read-write memory buffer 18, as well as CPU 20, and ROM 22, and the read-write memory buffer 18 is connected to read-write memory 24. The memory buffer 18 may also comprise a six-bit shift register, similar to keyboard buffer 16. Memory buffer 18 stores information which is to be transferred into or out of read-write memory 24. Calculator 10 is provided with a PROG/RUN switch 30 connected to CPU 20 by line 31 which enables the read-write memory to either store information from the keyboard or read out stored information to the CPU and ROM. When switch 30 is in the PROG or program position, execution of instructions corresponding to depressed keys is inhibited and the key codes are entered into the memory buffer 18 from keyboard buffer 16 and then into read-write memory 24. When switch 30 is placed in the RUN position, functions corresponding to the various keys will be executed when those keys are depressed. Programs stored in read-write memory 24 may be executed in Run mode by depressing a program initiation key.

In the illustrated embodiment, programs may be stored in the read-write memory and later initiated by actuating a Run/Stop key, R/S, or any one of the keys labeled A through E. The A-E keys facilitate the storage and recall of several different programs and subroutines in a single read-write memory. To store a program that will be recalled by depressing key A, the user switches PROG/RUN switch 30 to PROG, depresses the LBL key and then the A key. Next, the user actuates various keys on the keyboard in the order the functions are to be performed in the program. The last key in the program is RTN, which causes the calculator to return to the manual mode after the program has been executed and functions much as an END statement in a computer program. Further description of the components and operation of a programmable calculator, as described above, may be found in a U.S. Patent Application by Thomas E. Osborne, et al., entitled "Calculator Having Pre-Programmed User Definable Functions," Ser. No. 419,153, filed Nov. 26, 1973, now U.S. Pat. No. 4,037,092 and assigned to the assignee of the instant application and in a U.S. Patent Application by Robert E. Watson, entitled "Improved Programmable Calculator," Ser. No. 153,437, filed June 15, 1971, now U.S. Pat. No. 3,859,635 also assigned to the assignee of the instant application.

As previously mentioned, some of the functions performed by calculator 10 require the depression of a prefix key before the function can be initiated or programmed. For example, to take the logarithm (log) of a number, the "*f*" key must first be depressed and then the "8" key. These two key strokes will instruct the calculator to take the natural logarithm of a number already entered into the calculator. If only the "8" key were depressed, the number eight would be entered into the calculator rather than initiating the logarithm function. Similarly, to take the antilog of a number, the "$f^{-1}$" key is first depressed and then the "8" key is depressed. Similarly, the absolute value of a number may be determined by first depressing the "*g*" key followed by the "6" key. Two other prefix keys are also shown, STO and RCL, which are used for storing and recalling numerical constants. A number may be stored in any one of nine registers by entering the number and then pressing the STO key followed by one of the digits 1 through 9 to designate one of the nine storage registers. That same number may be recalled by depressing RCL followed by the digit key indicating the register in which the number is stored.

When a program is stored using any of the foregoing operations, two key codes must be stored: the prefix key code and the function key code. Thus, two positions in read-write memory 24 are used to store the instructions for a single operation. If a number of these functions are used in a program, a substantial amount of limited storage space will be used up with the prefix key codes. The amount of space used up by prefix key codes may be reduced by assigning some of the unused key codes (i.e., the key codes not assigned to the 35 keys on the keyboard) to a combination of a prefix key and a function key so that only a single position in read-write memory 24 is used to store the merged code for an instruction requiring two key strokes. These merged codes can be generated by checking each key code to see whether a prefix key has previously been depressed and, if it has, whether that key is one for which a merged code exists. If a merged code does exist, that code will be generated in response to an instruction from ROM 22 and will be inserted into memory 24 via CPU 20 in place of the prefix and function key codes. By way of example, Table I lists the functions, their key codes and corresponding merged codes (in octal form) used in the illustrated embodiment.

TABLE I

| Function | Key Codes Merged | | Merged Code |
|---|---|---|---|
| STO 1 | 13 | 04 | 61 |
| STO 2 | " | 03 | 60 |
| STO 3 | " | 02 | 57 |
| STO 4 | " | 24 | 01 |
| STO 5 | " | 23 | 55 |
| STO 6 | " | 22 | 05 |
| STO 7 | " | 64 | 45 |
| STO 8 | " | 63 | 65 |
| RCL 1 | 12 | 04 | 41 |
| RCL 2 | " | 03 | 40 |
| RCL 3 | " | 02 | 37 |
| RCL 4 | " | 24 | 27 |
| RCL 5 | " | 23 | 35 |
| RCL 6 | " | 22 | 25 |
| RCL 7 | " | 64 | 20 |
| RCL 8 | " | 63 | 17 |
| g x ≠ y | 10 | 56 | 07 |
| g x ≦ y | " | 54 | 67 |
| g x = y | " | 53 | 31 |
| g x > y | " | 52 | 51 |
| g x ⇄ y | " | 64 | 21 |
| g R ↓ | " | 63 | 15 |
| g R ↑ | " | 62 | 11 |
| g NOP | " | 04 | 00 |
| g LSTX | " | 44 | 74 |

Figure 2:
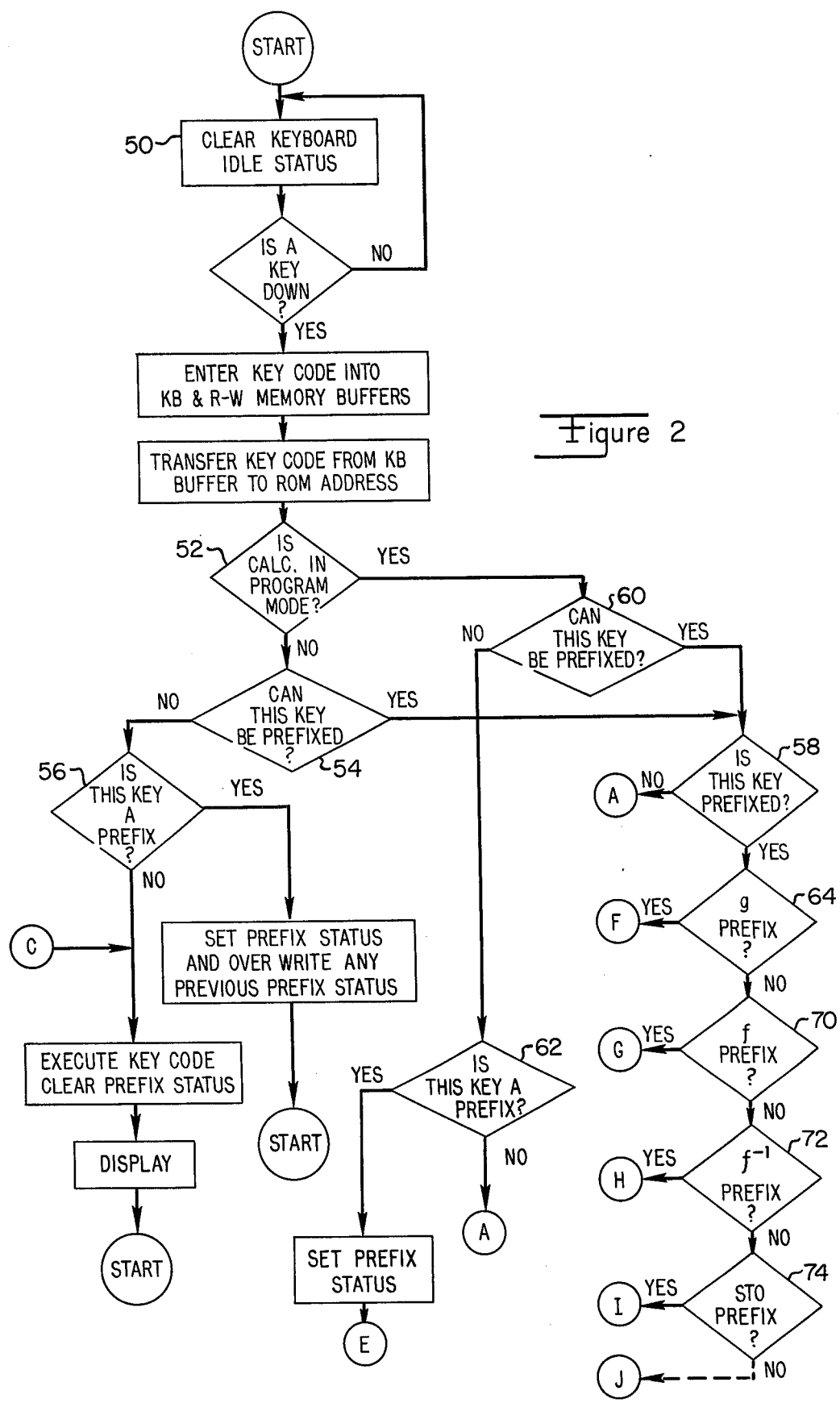
FIGS. 2 and 3 show a flow chart of the operation of the preferred embodiment.
Figure 3:
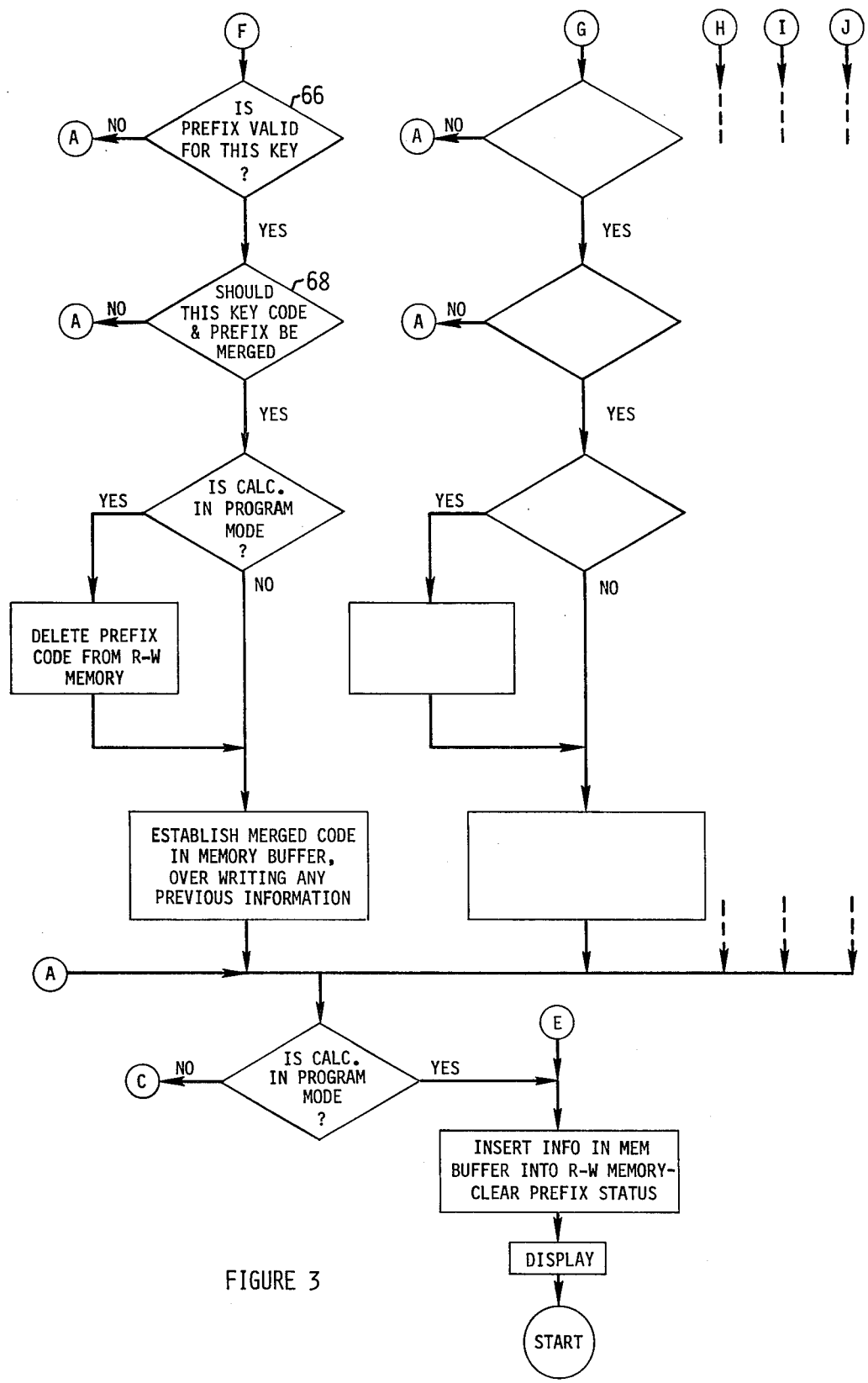

FIGS. 2 and 3 show a flow chart of the ROM program used to check for key codes to be merged and to generate the merged codes. Until a key is depressed, the calculator remains in an idle status, 50, and the keyboard is cleared. When a key is depressed, the key code is entered into the keyboard buffer 16 and the read-write memory buffer 18 and that key code is used to establish an address in ROM 22. That address location in ROM 22 initiates the program starting at decision block 52 in FIG. 2. If the calculator is not in the Program mode, that is, if it is in the Run mode, the calculator checks to see whether the key is one that can be prefixed. If the key cannot be prefixed, the calculator, then checks at block 56, to see if the key is a prefix. If it is not a prefix, the instruction corresponding to that key code is executed and the calculator then returns to the idle status. If the key is a prefix, then a prefix status is established in a status register 32 connected to CPU 20, overwriting any previously established prefix status. The status register may be, for example, a five-bit shift register with one bit for each of the prefix keys. After the status is set, the calculator returns to the idle status awaiting the depression of another key.

If the key depressed can be validly prefixed, the calculator checks to see if the key is prefixed, at block 58. If this key has not been prefixed, then the instruction corresponding to the depressed key is executed. If the key has been prefixed, the merged code routine, described below, is initiated.

The previous paragraph discussed the operation of the calculator in the Run mode; if the calculator is in the Program mode, the calculator then checks whether the depressed key can be prefixed, at decision block 60. If the key cannot be prefixed, the calculator checks, at decision block 62, whether the depressed key is a prefix. If the key is a prefix, prefix status is set in status register 32. The key code in the memory buffer is inserted into the read-write memory and calculator returns to the idle status. If the key was not a prefix, then the instruction corresponding to that key is executed. If the key can be prefixed, decision block 58 interrogates whether the key is prefixed. If not prefixed, the key instruction is executed; if the key is prefixed, the calculator then checks for which prefix was assigned, as shown at decision blocks 64, 70, 72 and 74. The dashed lines in the figures indicate that any number of prefix keys could be checked for in the manner described below.

A "yes" answer from any of the decision blocks 64, 70, 72 or 74 initiates a branch to the flow chart in FIG. 3. For example, decision block 64 is a check for the "g" prefix. If the preceding key was a "g" prefix key, the calculator checks at block 66 to see if this prefix "g" is valid for the key which has just been depressed, since not all prefixes will necessarily apply to all keys. If the prefix is not valid for this key, the prefix status will be cleared and the key code corresponding to the key depressed will be entered into the read-write memory. If the prefix is valid for this key, the calculator will check, at decision block 68, whether this is one of the key codes which should be merged with the prefix. If it is not, prefix status will be cleared and the key code will be entered into the read-write memory. If merger should take place, then the calculator once again checks for the Program mode. If the calculator is in the Program mode, the prefix key code is deleted from the read-write memory and then the merged code address is established in the read-write memory instead, overwriting any previous information. The merged code may be generated by the use of a look-up table in ROM 22 or through a numerical subroutine which generates a unique number in response to the prefix and function key codes being merged. If the calculator is not in the Program mode, the step deleting the prefix code from the read-write memory is skipped. The merged code is then transferred to ROM 22. If the calculator is not in the Program mode, the instruction corresponding to the key code will be executed. If the calculator is in the Program mode, the merged code is inserted into the read-write memory.

If the prefix that was previously established was not the "g" prefix, decision blocks 70, 72, 74, etc. will check for the other prefixes and will then perform the same checks of validity of the prefix and validity of merging for the particular combination of instruction and prefix.

As illustrated in FIG. 1 taken together with Table I, not all of the instructions requiring a prefix will necessarily generate merged codes, and those selected for merging are those that may be used more frequently in programming. The foregoing flow chart can be implemented in a read-only memory as shown in the program below in Table II as well as in equivalent hardware logic employing well-known techniques of logic design with gates and flip-flops. To assist the reader in understanding the operation of the program in Table II, the instructions used to generate a merged code for "$x>y$", requiring the depression of the "g" and "RTN" keys, are underlined. In addition, the corresponding decision blocks have been indicated by reference designator in the extreme right-hand column of the Table. The starting points of the ROM programs for the other keys are indicated by the key labels in the extreme right-hand column of the ROM 02 Object Program.

TABLE II

ROM00 OBJECT PROGRAM

```
 0   L00000:  11.....1.1   -> L0301      DUMMY :  JSB PW00
 1   L00001:  ..1.111.11   -> L0056      ST04  :  GO TO ST04S
 2   L00002:  ..........                          NO OPERATION
 3   L00003:  ..........                          NO OPERATION
 4   L00004:  1.1..11.11   -> L0246               GO TO DEC7
 5   L00005:  ..1.11..11   -> L0054      ST06  :  GO TO ST06S
 6   L00006:  1111..11.1   -> L0363      TNX1  :  JSB TNX2
 7   L00007:  11.11...1.                 ST023 :  A - 1 -> A[P]
 8   L00010:  11.11...1.                          A - 1 -> A[P]
 9   L00011:  11..1.1111   -> L0313               IF NO CARRY GO TO ST013
10   L00012:  111....111   -> L0341               GO TO MIH20
11   L00013:  ..........                          NO OPERATION
12   L00014:  11.11...1.                 RCL18 :  A - 1 -> A[P]
13   L00015:  .11.1...11   -> L0150               IF NO CARRY GO TO RCL19
14   L00016:  ...1.1.1.1   -> L0025               JSB RCL6
15   L00017:  ...11.1.11   -> L0032      RCL8  :  GO TO RCL8S
16   L00020:  ...11.1111   -> L0033      RCL7  :  GO TO RCL7S
17   L00021:  .1.11...1.                 ST031 :  C - 1 -> C[P]
18   L00022:  1.......11   -> L0200               IF NO CARRY GO TO ST032
19   L00023:  1.11.11..1   -> L0266               JSB CLRST
20   L00024:  111111..1    -> L0374               GO TO ST030
21   L00025:  ...111..11   -> L0034      RCL6  :  GO TO RCL6S
22   L00026:  .1111..111   -> L0171               GO TO NOSFX2
23   L00027:  ...1111.11   -> L0036      RCL4  :  GO TO RCL4S
24   L00030:  1.11111...                 LSTX2 :  DATA -> C
```

| | | |
|---|---|---|
| 25 | L00031: | 11.1.1.111 -> L0325 |
| 26 | L00032: | 11111.1.1. |
| 27 | L00033: | 11111.1.1. |
| 28 | L00034: | 11111.1.1. |
| 29 | L00035: | 11111.1.1. |
| 30 | L00036: | 11111.1.1. |
| 31 | L00037: | 11111.1.1. |
| 32 | L00040: | 11111.1.1. |
| 33 | L00041: | 11111.1.1. |
| 34 | L00042: | ..11.1.1.. -> L0327 |
| 35 | L00043: | 11.1.11111 -> L0341 |
| 36 | L00044: | 111...111 -> L0341 |
| 37 | L00045: | ..1.1.1111 -> L0053 |
| 38 | L00046: | 1....1.1.. |
| 39 | L00047: | 1...111.11 -> L0216 |
| 40 | L00050: | 1...111111 -> L0217 |
| 41 | L00051: | .......... |
| 42 | L00052: | 11111.1.1. |
| 43 | L00053: | 11111.1.1. |
| 44 | L00054: | 11111.1.1. |
| 45 | L00055: | 11111.1.1. |
| 46 | L00056: | 11111.1.1. |
| 47 | L00057: | 11111.1.1. |
| 48 | L00060: | 11111.1.1. |
| 49 | L00061: | 11111.1.1. |
| 50 | L00062: | ..11.1.1.. |
| 51 | L00063: | 11.1...111 -> L0321 |
| 52 | L00064: | 111....111 -> L0341 |
| 53 | L00065: | ..1.1.1.11 -> L0052 |
| 54 | L00066: | 11.11....1 |
| 55 | L00067: | 11.11....1 |
| 56 | L00070: | .11111..11 -> L0174 |
| 57 | L00071: | 111....111 -> L0341 |
| 58 | L00072: | 11.11....1 |
| 59 | L00073: | 1.11111.11 -> L0276 |
| 60 | L00074: | .....1.1.1 -> L0005 |
| 61 | L00075: | ..11...11. |
| 62 | L00076: | ..1.1.1... |
| 63 | L00077: | 1.111..1.. |
| 64 | L00100: | ...111.... |
| 65 | L00101: | 1.11.1.1.. |
| 66 | L00102: | .1....1.11 -> L0104 |
| 67 | L00103: | .1..1.1... |
| 68 | L00104: | ..11..111. |
| 69 | L00105: | 1..111.... -> L0030 |
| 70 | L00106: | ....11..11 -> L0030 |
| 71 | L00107: | 11.11....1 |
| 72 | L00110: | .1..1.1.11 -> L0112 |
| 73 | L00111: | ..1......1 -> L0040 |
| 74 | L00112: | 11.11....1 |
| 75 | L00113: | 111111.111 -> L0375 |
| 76 | L00114: | ...11111.1 -> L0037 |
| 77 | L00115: | .....11.11 -> L0006 |
| 78 | L00116: | .1.1..11.. |
| 79 | L00117: | .11.1..1.. |
| 80 | L00120: | 1....11.11 -> L0206 |
| 81 | L00121: | .1.11...1. |
| 82 | L00122: | .11.1..1.. |
| 83 | L00123: | .11.1.1111 -> L0153 |
| 84 | L00124: | .11.1..1.. |
| 85 | L00125: | ..1..11... |
| 86 | L00126: | .111.1...1 -> L0164 |
| 87 | L00127: | 1111.11111 -> L0367 |
| 88 | L00130: | ....1.111. |
| 89 | L00131: | .1....111. |
| 90 | L00132: | ....1111.. |
| 91 | L00133: | .11.1.11.. |
| 92 | L00134: | .1.11..111 -> L0131 |
| 93 | L00135: | 111.1.111. |
| 94 | L00136: | 1..111.... |
| 95 | L00137: | 111.1.111. |
| 96 | L00140: | ....11.... |
| 97 | L00141: | 11.11....1 |
| 98 | L00142: | ....11..11 -> L0014 |
| 99 | L00143: | ...111.1.1 -> L0035 |

```
              GO TO FRTN11
RCL8S  :  A + 1 -> A[X]
RCL7S  :  A + 1 -> A[X]
RCL6S  :  A + 1 -> A[X]
RCL5   :  A + 1 -> A[X]
RCL4S  :  A + 1 -> A[X]
RCL3   :  A + 1 -> A[X]
RCL2   :  A + 1 -> A[X]
RCL1   :  A + 1 -> A[X]
          IF S3 # 1
              THEN GO TO RCL23
          GO TO MIN20
ST07   :  GO TO ST07S
UFCN10 :  IF S8 # 1
              THEN GO TO UFCN11
          GO TO WAIT40
          NO OPERATION
ST08S  :  A + 1 -> A[X]
ST07S  :  A + 1 -> A[X]
ST06S  :  A + 1 -> A[X]
ST05   :  A + 1 -> A[X]
ST04S  :  A + 1 -> A[X]
ST03   :  A + 1 -> A[X]
ST02   :  A + 1 -> A[X]
ST01   :  A + 1 -> A[X]
          IF S3 # 1
              THEN GO TO ST022
          GO TO MIN20
ST08   :  GO TO ST08S
RCL25  :  A - 1 -> A[P]
          A - 1 -> A[P]
          IF NO CARRY GO TO RCL12
          GO TO MIN20
ST018  :  A - 1 -> A[P]
          IF NO CARRY GO TO ST019
          JSB ST06
LSTX0  :  0 -> C[M]
          C EXCHANGE M
          0 -> S11
          0 -> F1
          IF S11 # 1
              THEN GO TO LSTX1
          C -> STACK
LSTX1  :  0 -> C[W]
          C -> DATA ADDRESS
          GO TO LSTX2
RCL14  :  A - 1 -> A[P]
          IF NO CARRY GO TO RCL15
          JSB RCL2
RCL15  :  A - 1 -> A[P]
          IF NO CARRY GO TO RCL16
          JSB RCL3
          GO TO TNX1
SDGT2  :  5 -> P
          IF C[P] = 0
              THEN GO TO SDGT3
          C - 1 -> C[P]
          IF C[P] = 0
              THEN GO TO ST011
          C - 1 -> C[P]
          2 -> P
          JSB ADRS3
          GO TO ST010
ADRS4  :  0 -> B[W]
ADRS1  :  SHIFT LEFT A[W]
          P + 1 -> P
          IF P # 12
              THEN GO TO ADRS1
          A EXCHANGE C[W]
          C -> DATA ADDRESS
          A EXCHANGE C[W]
          RETURN
RCL17  :  A - 1 -> A[P]
          IF NO CARRY GO TO RCL18
          JSB RCL5
```

```
100  L00144:  1....1....   -> L4145   *****  SDGT4 :  SELECT ROM 4
101  L00145:  11.11...1.                   ST015 :  A - 1 -> A[P]
102  L00146:  111.1...11   -> L0350                  IF NO CARRY GO TO ST016
103  L00147:  ...1.1111.1  -> L0057                  JSB ST03
104  L00150:  11.11...1.                   RCL19 :  A - 1 -> A[P]
105  L00151:  1....1.111   -> L0205                  IF NO CARRY GO TO RCL20
106  L00152:  ...1....1    -> L0020                  JSB RCL7
107  L00153:  1...1.1..1   -> L0212        ST011 :  JSB CLRM
108  L00154:  ..11.1.1..                            IF S3 # 1
109  L00155:  11.1..1111   -> L0323                    THEN GO TO ST012
110  L00156:  11111...1.                            A + 1 -> A[P]
111  L00157:  .....11111   -> L0007                  IF NO CARRY GO TO ST023
112  L00160:  111....111   -> L0341                  GO TO MIN20
113  L00161:  11.11...1.                   ST014 :  A - 1 -> A[P]
114  L00162:  .11..1.111   -> L0145                  IF NO CARRY GO TO ST015
115  L00163:  ..11.....1   -> L0060                  JSB ST02
116  L00164:  .1......1..                  ADRS3 :  1 -> S4
117  L00165:  1..1111.1.                   ADRS0 :  IF A[XS] >= 1
118  L00166:  .1.11...11   -> L0130                    THEN GO TO ADRS4
119  L00167:  .1...1.1..                            IF S4 # 1
120  L00170:  .1111.1111   -> L0173                    THEN GO TO NOSFX1
121  L00171:  1...1.1..1   -> L0212        NOSFX2:  JSB CLRM
122  L00172:  11111.....                   NOSFX3:  0 -> F7
123  L00173:  .1...1....   -> L2174   *****  NOSFX1:  SELECT ROM 2
124  L00174:  1..1.....1   -> L0220        RCL12 :  JSB MDL0
125  L00175:  11.11...1.                            A - 1 -> A[P]
126  L00176:  .1...11111   -> L0107                  IF NO CARRY GO TO RCL14
127  L00177:  ..1...1.1    -> L0041                  JSB RCL1
128  L00200:  .1.11...1.                   ST032 :  C - 1 -> C[P]
129  L00201:  11..111111   -> L0317                  IF NO CARRY GO TO ST036
130  L00202:  1.11.11..1   -> L0266                  JSB CLRST
131  L00203:  1.1..1...1   -> L0244                  JSB MPY20
132  L00204:  1.1...1111   -> L0243                  GO TO SQX1
133  L00205:  ....1111.1   -> L0017        RCL20 :  JSB RCL8
134  L00206:  ..11.1.1..                   SDGT3 :  IF S3 # 1
135  L00207:  .11..1..11   -> L0144                    THEN GO TO SDGT4
136  L00210:  1..1.....1   -> L5211   *****           SELECT ROM 5
137  L00211:  .11..1....   -> L3212   *****  FACT0 :  SELECT ROM 3
138  L00212:  ..11...11.                   CLRM  :  0 -> C[M]
139  L00213:  ..1.1.1...                            C EXCHANGE M
140  L00214:  ..1...11..                            2 -> P
141  L00215:  ....11....                            RETURN
142  L00216:  1.1...1.1.                   UFCN11:  1 -> S10
143  L00217:  ..1..1..1.   -> L1220   *****  WAIT40:  SELECT ROM 1
144  L00220:  111.1.....                   MDL0  :  1 -> F7
145  L00221:  .11.......                            MEMORY DELETE
146  L00222:  1.111..1..                            0 -> S11
147  L00223:  1.111.....                   MDL1  :  0 -> F5
148  L00224:  1.11.1.1..                            IF S11 # 1
149  L00225:  1..1..1111   -> L0223                    THEN GO TO MDL1
150  L00226:  1.111.....                            0 -> F5
151  L00227:  ....11....                            RETURN
152  L00230:  .1....11..                   SDGT1 :  4 -> P
153  L00231:  .11.1...1.                            IF C[P] = 0
154  L00232:  .1..111.11   -> L0116                    THEN GO TO SDGT2
155  L00233:  1..1.1..1    -> L0212        RCL10 :  JSB CLRM
156  L00234:  ..11.1.1..                            IF S3 # 1
157  L00235:  11.11..111   -> L0331                    THEN GO TO RCL11
158  L00236:  11111...1.                            A + 1 -> A[P]
159  L00237:  ..11.11.11   -> L0066                  IF NO CARRY GO TO RCL25
160  L00240:  111....111   -> L0341                  GO TO MIN20
161  L00241:  ..11.1.1.1   -> L0065        ST020 :  JSB ST08
162  L00242:  11.1.1.111   -> L0325                  GO TO FRTN11
163  L00243:  ..11..1111                   SQX1  :  C -> A[W]
164  L00244:  11...1....   -> L6245   *****  MPY20 :  SELECT ROM 6
165  L00245:  11...1....   -> L6246   *****  DVD20 :  SELECT ROM 6
166  L00246:  11....11..                   DEC7  :  12 -> P
167  L00247:  .11.1...1.                            IF C[P] = 0
168  L00250:  .1111..111   -> L0171                    THEN GO TO NOSFX2
169  L00251:  ..1..11...                            LOAD CONSTANT 2
170  L00252:  ..1.1.1...                            C EXCHANGE M
171  L00253:  1...111111   -> L0217                  GO TO WAIT40
172  L00254:  .1.....11.                   FRAC2 :  SHIFT LEFT A[M]
173  L00255:  11.11.1.1.                            A - 1 -> A[X]
174  L00256:  ....1111..                            P + 1 -> P
175  L00257:  11..1.11..                   FRAC1 :  IF P # 12
```

| # | Label | Bits | Jump | | Mnemonic | Instruction |
|---|---|---|---|---|---|---|
| 176 | L00260: | 1.1.11..11 | -> L0254 | | | THEN GO TO FRAC2 |
| 177 | L00261: | 111.1.111. | | | | A EXCHANGE C[W] |
| 178 | L00262: | .11...111. | | | | C -> A[W] |
| 179 | L00263: | 1.111.1.1. | | | | 0 -> A[X] |
| 180 | L00264: | 1.1.11.1.. | | ##### | | DELAYED SELECT GROUP 1 |
| 181 | L00265: | .11..1.111 | -> L0145 | | | GO TO @145 |
| 182 | L00266: | ..11...11. | | | CLRST : | 0 -> C[M] |
| 183 | L00267: | ..1.1.1... | | | | C EXCHANGE M |
| 184 | L00270: | 11....11.. | | | | 12 -> P |
| 185 | L00271: | .11..11.111 | | | CLRST1 : | C -> A[W] |
| 186 | L00272: | 1.11111... | | | | DATA -> C |
| 187 | L00273: | 111.1.111. | | | | A EXCHANGE C[W] |
| 188 | L00274: | 1.1111.... | | | | C -> DATA |
| 189 | L00275: | ....11.... | | | | RETURN |
| 190 | L00276: | 11.11...1. | | | STO19 : | A - 1 -> A[P] |
| 191 | L00277: | 1.1....111 | -> L0241 | | | IF NO CARRY GO TO STO20 |
| 192 | L00300: | ..1...1.1.1 | -> L0045 | | | JSB STO7 |
| 193 | L00301: | 1.1.11.1.. | | ##### | PWO0 : | DELAYED SELECT GROUP 1 |
| 194 | L00302: | .1...1.... | -> L2303 | ***** | | SELECT ROM 2 |
| 195 | L00303: | .......... | | | | NO OPERATION |
| 196 | L00304: | .......... | | | | NO OPERATION |
| 197 | L00305: | 11.1111.1. | | | GDGT2 : | A - 1 -> A[XS] |
| 198 | L00306: | 11..1..11 | -> L0310 | | | IF NO CARRY GO TO GDGT3 |
| 199 | L00307: | 1...1.111 | -> L0211 | | | GO TO FACT0 |
| 200 | L00310: | 1.1..1... | -> L5311 | ***** | GDGT3 : | SELECT ROM 5 |
| 201 | L00311: | 1.1.111111 | -> L0257 | | | GO TO FRAC1 |
| 202 | L00312: | .1111..111 | -> L0171 | | | GO TO NOSFX2 |
| 203 | L00313: | 1..1.....1 | -> L0220 | | STO13 : | JSB MDL0 |
| 204 | L00314: | 11.11...1. | | | | A - 1 -> A[P] |
| 205 | L00315: | .111...111 | -> L0161 | | | IF NO CARRY GO TO STO14 |
| 206 | L00316: | ..11...1.1 | -> L0061 | | | JSB STO1 |
| 207 | L00317: | 1.11.11..1 | -> L0266 | | STO36 : | JSB CLRST |
| 208 | L00320: | 1.1..1.1.1 | -> L0245 | | | JSB DVD20 |
| 209 | L00321: | 1...1.1..1 | -> L0212 | | STO22 : | JSB CLRM |
| 210 | L00322: | ......11.. | | | | 0 -> P |
| 211 | L00323: | .111.1.1.1 | -> L0165 | | STO12 : | JSB ADRS0 |
| 212 | L00324: | 1.1111.... | | | | C -> DATA |
| 213 | L00325: | .1...1.... | -> L2326 | ***** | FRTN11: | SELECT ROM 2 |
| 214 | L00326: | .1...1.... | -> L2327 | ***** | FRTN10: | SELECT ROM 2 |
| 215 | L00327: | 1...1.1..1 | -> L0212 | | RCL23 : | JSB CLRM |
| 216 | L00330: | ......11.. | | | | 0 -> P |
| 217 | L00331: | .111.1.1.1 | -> L0165 | | RCL11: | JSB ADRS0 |
| 218 | L00332: | 1.111..1.. | | | | 0 -> S11 |
| 219 | L00333: | ..111..... | | | | 0 -> F1 |
| 220 | L00334: | 1.11..1... | | | | IF S11 # 1 |
| 221 | L00335: | 11.1111111 | -> L0337 | | | THEN GO TO RCL22 |
| 222 | L00336: | .1...1.1... | | | | C -> STACK |
| 223 | L00337: | 1.11111... | | | RCL22 : | DATA -> C |
| 224 | L00340: | 11.1.1.111 | -> L0325 | | | GO TO FRTN11 |
| 225 | L00341: | 1....1.... | -> L4342 | ***** | MIN20 : | SELECT ROM 4 |
| 226 | L00342: | 1.111..1.1 | -> L0271 | | | JSB CLRST1 |
| 227 | L00343: | 111.1.111. | | | | A EXCHANGE C[W] |
| 228 | L00344: | 1...111111 | -> L0217 | | | GO TO WAIT40 |
| 229 | L00345: | .......... | | | | NO OPERATION |
| 230 | L00346: | .......... | | | | NO OPERATION |
| 231 | L00347: | .......... | | | | NO OPERATION |
| 232 | L00350: | 11.11...1. | | | STO16 : | A - 1 -> A[P] |
| 233 | L00351: | 111.11..11 | -> L0354 | | | IF NO CARRY GO TO STO17 |
| 234 | L00352: | ........1.1 | -> L0001 | | | JSB STO4 |
| 235 | L00353: | .1111..111 | -> L0171 | | | GO TO NOSFX2 |
| 236 | L00354: | 11.11...1. | | | STO17 : | A - 1 -> A[P] |
| 237 | L00355: | ..111.1.11 | -> L0072 | | | IF NO CARRY GO TO STO18 |
| 238 | L00356: | ..1.11.1.1 | -> L0055 | | | JSB STO5 |
| 239 | L00357: | .......... | | | | NO OPERATION |
| 240 | L00360: | .......... | | | | NO OPERATION |
| 241 | L00361: | ....1..... | | | | BUFFER -> ROM ADDRESS |
| 242 | L00362: | ........11 | -> L0000 | | | GO TO DUMMY |
| 243 | L00363: | ..1....1.. | | | TNX2 : | 1 -> S2 |
| 244 | L00364: | .11...111. | | | | C -> A[W] |
| 245 | L00365: | 111.1..... | -> L7366 | ***** | | SELECT ROM 7 |
| 246 | L00366: | .......... | | | | NO OPERATION |
| 247 | L00367: | .1.1..11 | | | STO10 : | 5 -> P |
| 248 | L00370: | .1.11...1. | | | | C - 1 -> C[P] |

```
249  L00371:  ...1...111   -> L0021              IF NO CARRY GO TO ST031
250  L00372:  1.11.11..1   -> L0266              JSB CLRST
251  L00373:  ..1111111.                         0 - C - 1 -> C[S]
252  L00374:  1.1..1....   -> L5375    *****  ST030 : SELECT ROM 5
253  L00375:  11.11...1.                  RCL16 : A - 1 -> A[P]
254  L00376:  .11....111   -> L0141              IF NO CARRY GO TO RCL17
255  L00377:  ...1.111.1   -> L0027              JSB RCL4

ROM01 OBJECT PROGRAM

0    L01000:  .11...11..
1    L01001:  ...11...1.
2    L01002:  ..11.11.11   -> L1066            DEC6  : 6 -> P
3    L01003:  .....1....   -> L0004    *****          IF C[P] >= 1
4    L01004:  1....1....   -> L4005    *****                THEN GO TO DEC8
5    L01005:  1111111.1.                       SELECT ROM 0
6    L01006:  1...11.111   -> L1215            DSZ6  : SELECT ROM 4
7    L01007:  1.1.11.1..              #####    FDGT8 : A + 1 -> A[XS]
8    L01010:  ...1..1...   -> L1011    *****          IF NO CARRY GO TO DOCT0
9    L01011:  1...11..11                       DELAYED SELECT GROUP 1
10   L01012:  .1..1.1111   -> L1113            SELECT ROM 1
11   L01013:  .1..111111   -> L1117    DSZ5   : IF A[M] >= 1
12   L01014:  .11.1..11.                             THEN GO TO DSZ10
13   L01015:  .111.1..11   -> L1164            GO TO DSZ7
14   L01016:  1.1.11.1..              #####    ENTR2 : IF C[M] = 0
15   L01017:  .1...1....   -> L2020    *****          THEN GO TO ENTR1
16   L01020:  ..........                       DELAYED SELECT GROUP 1
17   L01021:  1.1111.1.1   -> L1275            SELECT ROM 2
18   L01022:  111.111.11   -> L1356            NO OPERATION
19   L01023:  .11.1..11.                       JSB WAIT3
20   L01024:  ...11..111   -> L1031            GO TO WAIT40
21   L01025:  1..1...11.              DSZ3    : IF C[M] = 0
22   L01026:  .1.11.1.1.                             THEN GO TO DSZ4
23   L01027:  .1..11.1..                       SHIFT RIGHT C[M]
24   L01030:  ...1..1111   -> L1023            C - 1 -> C[X]
25   L01031:  ...111111.              DSZ2    : IF C[X] >= 1
26   L01032:  1.11.1..11   -> L1264                  THEN GO TO DSZ3
27   L01033:  11.1....11              DSZ4    : IF C[S] >= 1
28   L01034:  ....1..111   -> L1011                  THEN GO TO DSZ13
29   L01035:  ..1111111.                       A - C -> A[M]
30   L01036:  1.1111....                       IF NO CARRY GO TO DSZ5
31   L01037:  1...1.111.                       0 - C - 1 -> C[S]
32   L01040:  1..111...1   -> L1234   DSZ8    : C -> DATA
33   L01041:  1.111..1..                       B EXCHANGE C[W]
34   L01042:  ...11.....                       JSB DSZ12
35   L01043:  1.11.1.1..              WAIT30  : 0 -> S11
36   L01044:  1...1...11   -> L1220            0 -> F0
37   L01045:  1.1.11.1..              #####    IF S11 # 1
38   L01046:  ..1..1....   -> L1047    *****          THEN GO TO WAIT10
39   L01047:  ..........                       DELAYED SELECT GROUP 1
40   L01050:  ....11..11   -> L1014            SELECT ROM 1
41   L01051:  .111111.1.                       NO OPERATION
42   L01052:  1.1.1..1..                       GO TO ENTR2
43   L01053:  .1.1.1.1..              WAIT11  : C + 1 -> C[XS]
44   L01054:  111.1...11   -> L1350   WAIT4   : 0 -> S10
45   L01055:  .1111.1.1.                       IF S5 # 1
46   L01056:  ...1..111    -> L1051                  THEN GO TO WAIT13
47   L01057:  11.11.1.11   -> L1332            C + 1 -> C[X]
48   L01060:  .11....1..                       IF NO CARRY GO TO WAIT11
49   L01061:  111.1.111.                       GO TO WAIT17
50   L01062:  .11..1....   -> L3063   *****    PTR5  : 1 -> S6
51   L01063:  .....111..                       A EXCHANGE C[W]
52   L01064:  .1111.1.1.                       SELECT ROM 3
53   L01065:  ..111.11.1   -> L1073   FIX5    : P - 1 -> P
54   L01066:  1.1..1....   -> L5067   *****             C + 1 -> C[X]
55   L01067:  ..........                       JSB FIX7
56   L01070:  ..11.11.1.              DEC8    : SELECT ROM 5
57   L01071:  11.11.1.1.                       NO OPERATION
58   L01072:  .1.11.1.1.              FIX3    : 0 -> C[XS]
59   L01073:  ........1.              FIX4    : 13 -> P
60   L01074:  ..11.1111    -> L1063            C - 1 -> C[X]
61   L01075:  11....11..              FIX7    : IF B[P] = 0
62   L01076:  1..11...1.                             THEN GO TO FIX5
63   L01077:  .11111..11   -> L1174            12 -> P
64   L01100:  .1.....11.              FIX6    : IF A[P] >= 1
                                                     THEN GO TO FIX2
                                               SHIFT LEFT A[M]
```

```
65  L01101:  .1.11.1.1.
66  L01102:  ...11111..1  -> L1076
67  L01103:  .1...1.1..
68  L01104:  .111.11.11   -> L1166
69  L01105:  1.1.1.111.
70  L01106:  .111.1111.
71  L01107:  1..11..11.
72  L01110:  1.11.11111   -> L1267
73  L01111:  ..1111111.
74  L01112:  1.11.111.1   -> L1267
75  L01113:  1..11...1.
76  L01114:  .1..111111   -> L1117
77  L01115:  .1....11..
78  L01116:  11.11.1.1.
79  L01117:  111.1.111.
80  L01120:  ...1111..1   -> L1036
81  L01121:  11111...1.
82  L01122:  11111.1.1.
83  L01123:  .1..1111.1   -> L1117
84  L01124:  .111..11..
85  L01125:  .11.1..1..
86  L01126:  ........11   -> L1000
87  L01127:  1.1..1....   -> L5130
88  L01130:  11.1111111   -> L1337
89  L01131:  ..111..1..
90  L01132:  .1..1.....
91  L01133:  ...1..11..
92  L01134:  .1.1......
93  L01135:  1.111..1..
94  L01136:  .1111.....
95  L01137:  ..11.1.1..
96  L01140:  .11.1.1.11   -> L1152
97  L01141:  1.11.1.1..   -> L1321
98  L01142:  11.1...111
99  L01143:  ..1.1.1...
100 L01144:  1.1.11.1..
101 L01145:  .11..1....   -> L3146
102 L01146:  .111111.1.
103 L01147:  ..111...11   -> L1070
104 L01150:  ..1.1.1.1.
105 L01151:  ...111..1.1 -> L1071
106 L01152:  1.11.1.1..
107 L01153:  1111.1..11   -> L1364
108 L01154:  .11.1..1..
109 L01155:  1...111.11   -> L1216
110 L01156:  .1.11...1.
111 L01157:  .11.1..1..
112 L01160:  1...111.11   -> L1216
113 L01161:  ..1..11...
114 L01162:  1.1.11.1..
115 L01163:  .....1....   -> L0164
116 L01164:  .1.111.1..
117 L01165:  .1....1111   -> L1103
118 L01166:  .11...1...   -> L3167
119 L01167:  111.1.111.
120 L01170:  .11...111.
121 L01171:  1..11..11.
122 L01172:  .11..11.11   -> L1146
123 L01173:  1.111..11.
124 L01174:  111.1..11.
125 L01175:  .1...1....   -> L2176
126 L01176:  1.1111.1.1   -> L1275
127 L01177:  ..11.1.1..
128 L01200:  1111..1111   -> L1363
129 L01201:  1....1....   -> L4202
130 L01202:  1111111.1.
131 L01203:  11...1.111   -> L1305
132 L01204:  .11.1.1...
133 L01205:  ...1..1...
134 L01206:  .1...1..1.
135 L01207:  .1.1...1..
136 L01210:  ..11....11   -> L1060
137 L01211:  ..11...11.
138 L01212:  .111...1.1   -> L1161
139 L01213:  ..........
140 L01214:  ..........
```

```
              C - 1 -> C[X]
              JSB FIX6
RTP3   :  IF S4 # 1
              THEN GO TO RTP4
              C + C -> C[W]
              A + C -> C[S]
              IF A[M] >= 1
              THEN GO TO RTP5
              0 - C - 1 -> C[S]
              JSB RTP5
DSZ10  :  IF A[P] >= 1
              THEN GO TO DSZ7
              SHIFT LEFT A[M]
              A - 1 -> A[X]
DSZ7   :  A EXCHANGE C[W]
              JSB DSZ8
DSZ11  :  A + 1 -> A[P]
              A + 1 -> A[X]
              JSB DSZ7
DEC5   :  7 -> P
              IF C[P] = 0
              THEN GO TO DEC6
              SELECT ROM 5
              GO TO WAIT29
WAIT16 :  0 -> S3
              1 -> F2
              1 -> P
              C EXCHANGE M
              0 -> S11
              0 -> F3
              IF S3 # 1
              THEN GO TO WAIT2
              IF S11 # 1
              THEN GO TO WAIT33
WAIT36 :  C EXCHANGE M
              DELAYED SELECT GROUP 1
              SELECT ROM 3
FIX1   :  C + 1 -> C[XS]
              IF NO CARRY GO TO FIX3
              0 - C -> C[X]
              JSB FIX4
WAIT2  :  IF S11 # 1
              THEN GO TO WAIT35
              IF C[P] = 0
              THEN GO TO DSCI50
              C - 1 -> C[P]
              IF C[P] = 0
              THEN GO TO DSCI50
WAIT39 :  LOAD CONSTANT 2
              DELAYED SELECT GROUP 1
              SELECT ROM 0
ENTR1  :  DELAYED SELECT ROM 2
              GO TO @103
RTP4   :  SELECT ROM 3
FIX0   :  A EXCHANGE C[W]
              C -> A[W]
              IF A[M] >= 1
              THEN GO TO FIX1
              0 -> A[M]
FIX2   :  A EXCHANGE C[M]
FRTN5  :  SELECT ROM 2
              JSB WAIT3
              IF S3 # 1
              THEN GO TO WAIT32
              SELECT ROM 4
F1DGTS :  A + 1 -> A[XS]
              IF NO CARRY GO TO ODEC0
PTR0   :  STACK -> A
              1 -> S1
              1 -> S4
              1 -> S5
              GO TO PTR5
WAIT44 :  0 -> C[M]
              JSB WAIT39
              NO OPERATION
              NO OPERATION
```

| | | | | | | |
|---|---|---|---|---|---|---|
| 141 | L01215: | .11..1.... | -> L3216 | ***** | DOCT0 : | SELECT ROM 3 |
| 142 | L01216: | 1.1.11.1.. | | ##### | DSCI50: | DELAYED SELECT GROUP 1 |
| 143 | L01217: | .....1.... | -> L0220 | ***** | | SELECT ROM 0 |
| 144 | L01220: | 1....1.1.. | | | WAIT10: | IF S8 # 1 |
| 145 | L01221: | .1.11..111 | -> L1131 | | | THEN GO TO WAIT16 |
| 146 | L01222: | 11....11.. | | | WAIT1 : | 12 -> P |
| 147 | L01223: | .....1.1.. | | | | IF S0 # 1 |
| 148 | L01224: | ..1.1..11 | -> L1052 | | | THEN GO TO WAIT4   START |
| 149 | L01225: | ....1111. | | | WAIT31: | P + 1 -> P |
| 150 | L01226: | 11..1.11.. | | | | IF P # 12 |
| 151 | L01227: | 1..1.1.111 | -> L1225 | | | THEN GO TO WAIT31 |
| 152 | L01230: | ....1..1.. | | | | 0 -> S0 |
| 153 | L01231: | 1.1..1.1.. | | | | IF S10 # 1 |
| 154 | L01232: | 1.1....111 | -> L1241 | | | THEN GO TO WAIT29 |
| 155 | L01233: | 1..1..1.11 | -> L1222 | | | GO TO WAIT1   START |
| 156 | L01234: | ..1.1.1... | | | DSZ12 : | C EXCHANGE M |
| 157 | L01235: | .......11. | | | | IF B[M] = 0 |
| 158 | L01236: | .....1..11 | -> L1004 | | | THEN GO TO DSZ6 |
| 159 | L01237: | .1...1.... | -> L2240 | ***** | DSZ9 : | SELECT ROM 2 |
| 160 | L01240: | ......1.... | -> L0241 | ***** | DEC7 : | SELECT ROM 0 |
| 161 | L01241: | .1.1.1.1.. | | | WAIT28: | IF S5 # 1 |
| 162 | L01242: | 11.111..11 | -> L1334 | | | THEN GO TO WAIT6 |
| 163 | L01243: | 11.1111111 | -> L1337 | | | GO TO WAIT29 |
| 164 | L01244: | 11...1.... | -> L6245 | ***** | MPY20 : | SELECT ROM 6 |
| 165 | L01245: | 11...1.... | -> L6246 | ***** | DVD20 : | SELECT ROM 6 |
| 166 | L01246: | .......... | | | | NO OPERATION |
| 167 | L01247: | 1.1..1.111 | -> L1245 | | | GO TO DVD20 |
| 168 | L01250: | 1...1.111. | | | DSZ0 : | B EXCHANGE C[W] |
| 169 | L01251: | ..11..111. | | | | 0 -> C[W] |
| 170 | L01252: | 11....11.. | | | | 12 -> P |
| 171 | L01253: | .1.11...1. | | | | C - 1 -> C[P] |
| 172 | L01254: | .1.11...1. | | | | C - 1 -> C[P] |
| 173 | L01255: | 1..111.... | | | | C -> DATA ADDRESS |
| 174 | L01256: | ....1..11. | | | | 0 -> B[M] |
| 175 | L01257: | 1.11111... | | | | DATA -> C |
| 176 | L01260: | .11...111. | | | DSZ1 : | C -> A[W] |
| 177 | L01261: | ..11...11. | | | | 0 -> C[M] |
| 178 | L01262: | .1111...1. | | | | C + 1 -> C[P] |
| 179 | L01263: | ...1.111.1 | -> L1027 | | | JSB DSZ2 |
| 180 | L01264: | 1111...11. | | | DSZ13 : | A + C -> A[M] |
| 181 | L01265: | .1..111111 | -> L1117 | | | IF NO CARRY GO TO DSZ7 |
| 182 | L01266: | .1.1...111 | -> L1121 | | | GO TO DSZ11 |
| 183 | L01267: | ...11..1.. | | | RTP5 : | 0 -> S1 |
| 184 | L01270: | .11..1.... | -> L3271 | ***** | | SELECT ROM 3 |
| 185 | L01271: | ..11..11.. | | | | 3 -> P |
| 186 | L01272: | ...11...1. | | | | IF C[P] >= 1 |
| 187 | L01273: | 1.1.1...11 | -> L1250 | | | THEN GO TO DSZ0 |
| 188 | L01274: | .1.1.1..11 | -> L1124 | | | GO TO DEC5 |
| 189 | L01275: | 11....11.. | | | WAIT3 : | 12 -> P |
| 190 | L01276: | .11.1..... | | | | 1 -> F3 |
| 191 | L01277: | 1...1.1... | | | | DISPLAY OFF |
| 192 | L01300: | ..1.1.1... | | | | C EXCHANGE M |
| 193 | L01301: | .1....111. | | | | SHIFT LEFT A[W] |
| 194 | L01302: | ....11.... | | | | RETURN |
| 195 | L01303: | ..1.1..... | | | WAIT41: | C EXCHANGE M |
| 196 | L01304: | 11...11.11 | -> L1306 | | | GO TO WAIT42 |
| 197 | L01305: | .11..11.11 | -> L3306 | ***** | ODEC0 : | SELECT ROM 3 |
| 198 | L01306: | 1.1.11.1.. | | ##### | WAIT42: | DELAYED SELECT GROUP 1 |
| 199 | L01307: | 11..1.1.11 | -> L1312 | | | GO TO @312 |
| 200 | L01310: | 1.1111.1.1 | -> L1275 | | WAIT8 : | JSB WAIT3 |
| 201 | L01311: | 111.1..... | | | | 1 -> F7 |
| 202 | L01312: | ..11.1.1.. | -> L1315 | | | IF S3 # 1          52 |
| 203 | L01313: | 11..11.111 | -> L1315 | | | THEN GO TO WAIT7 |
| 204 | L01314: | 1....1.... | -> L4315 | ***** | | SELECT ROM 4    PROG |
| 205 | L01315: | .1...1.... | -> L2316 | ***** | WAIT7 : | SELECT ROM 2    RUN |
| 206 | L01316: | .1....1111 | -> L1103 | | | GO TO RTP3 |
| 207 | L01317: | ..11..11. | | | WAIT45: | 0 -> C[M] |
| 208 | L01320: | 1...111..1 | -> L1216 | | | JSB DSCI50 |
| 209 | L01321: | ...11...1. | | | WAIT33: | IF C[P] >= 1 |
| 210 | L01322: | 111..1.11 | -> L1342 | | | THEN GO TO WAIT34 |
| 211 | L01323: | ....1.11.. | | | | LOAD CONSTANT 1 |
| 212 | L01324: | ..11..11.. | | | WAIT43: | 0 -> C[M] |
| 213 | L01325: | .11..11.1 | -> L1143 | | | JSB WAIT36 |
| 214 | L01326: | 1..1.1.1.. | | | WAIT9 : | IF S9 # 1 |
| 215 | L01327: | 1..1..1.11 | -> L1222 | | | THEN GO TO WAIT1 |
| 216 | L01330: | 1..11..1.. | | | | 0 -> S9 |

```
217   L01331:   1.1....1..
218   L01332:   ....1.1...
219   L01333:   1..1..1.11   -> L1222
220   L01334:   1.....1.1.
221   L01335:   11..1...11   -> L1310
222   L01336:   11...1111    -> L1303
223   L01337:   .11.1.....
224   L01340:   ....11.1..
225   L01341:   1..1....11   -> L1220
226   L01342:   .1.11...1.
227   L01343:   .1.11....1
228   L01344:   ....11.1..
229   L01345:   111111.11    -> L1374
230   L01346:   ...11.11...
231   L01347:   11.1.1.11    -> L1324
232   L01350:   1.....1.1.
233   L01351:   ..1....111   -> L1041
234   L01352:   11........
235   L01353:   ....1.1...
236   L01354:   ..1.1.1...
237   L01355:   .1.....111.
238   L01356:   1.111..1..
239   L01357:   1.111.....
240   L01360:   1.11.1.1..
241   L01361:   111.111111   -> L1357
242   L01362:   1.111.....
243   L01363:   .1....1...   -> L2364
244   L01364:   .11..1...1.
245   L01365:   1111111.11   -> L1376
246   L01366:   .1.11....1.
247   L01367:   .11.1....1.
248   L01370:   11..111111   -> L1317
249   L01371:   .1.11....1.
250   L01372:   ...11....1.
251   L01373:   1...1..111   -> L1211
252   L01374:   .1111...1.
253   L01375:   .1111....1.
254   L01376:   ..1.1.1...
255   L01377:   11.1.11.11   -> L1326

ROM02 OBJECT PROGRAM

0    L02000:   1.1...1.11   -> L2242
 1    L02001:   1111....11   -> L2360
 2    L02002:   1.1.1.....   -> L5003   *****
 3    L02003:   1.1.1.....   -> L5004   *****
 4    L02004:   1.1.1.....   -> L5005   *****
 5    L02005:   1111....11   -> L2360
 6    L02006:   11..1..11    -> L2310
 7    L02007:   1.1.1.....   -> L5010   *****
 8    L02010:   111..11111   -> L2347
 9    L02011:   111...1.11   -> L2342
10    L02012:   111..11111   -> L2347
11    L02013:   111..11111   -> L2347
12    L02014:   111..11111   -> L2347
13    L02015:   1...11.111   -> L2215
14    L02016:   111..11111   -> L2347
15    L02017:   1111....11   -> L2360
16    L02020:   1111....11   -> L2360
17    L02021:   11.1..1.11   -> L2322
18    L02022:   1.1.1.....   -> L5023   *****
19    L02023:   1.1.1.....   -> L5024   *****
20    L02024:   1.1.1.....   -> L5025   *****
21    L02025:   1111....11   -> L2360
22    L02026:   11..1..111   -> L2311
23    L02027:   1111....11   -> L2360
24    L02030:   111.1..111   -> L2351
25    L02031:   1.1.1.....   -> L5032   *****
26    L02032:   111.1..111   -> L2351
27    L02033:   111.1..111   -> L2351
28    L02034:   111.1..111   -> L2351
29    L02035:   1111....11   -> L2360
30    L02036:   111.1..111   -> L2351
31    L02037:   1111....11   -> L2360
32    L02040:   1111....11   -> L2360
```

```
WAIT23:  1 -> S10
WAIT17:  DISPLAY TOGGLE
         GO TO WAIT1
WAIT6 :  IF S8 # 1
              THEN GO TO WAIT8
         GO TO WAIT41
WAIT29:  1 -> F3
         CLEAR STATUS
WAIT25:  GO TO WAIT10
WAIT34:  C - 1 -> C[P]
         C - 1 -> C[P]
         IF C[P] >= 1
              THEN GO TO WAIT37
         LOAD CONSTANT 3
         GO TO WAIT43
WAIT13:  IF S8 # 1
              THEN GO TO WAIT30
         POINTER ADVANCE
         DISPLAY TOGGLE
         C EXCHANGE M
         SHIFT LEFT A[W]
WAIT40:  0 -> S11
WAIT27:  0 -> F5
         IF S11 # 1
              THEN GO TO WAIT27
         0 -> F5
WAIT32:  SELECT ROM 2
WAIT35:  IF C[P] = 0
              THEN GO TO WAIT38
         C - 1 -> C[P]
         IF C[P] = 0
              THEN GO TO WAIT45
         C - 1 -> C[P]
         IF C[P] >= 1
              THEN GO TO WAIT44
WAIT37:  C + 1 -> C[P]
         C + 1 -> C[P]
WAIT38:  C EXCHANGE M
         GO TO WAIT9

NOOP  :  GO TO NOOP1    NOP
STO4  :  GO TO FCN60    STO 4
DIG3  :  SELECT ROM 5   3
DIG2  :  SELECT ROM 5   2
DIG1  :  SELECT ROM 5   1
STO6  :  GO TO FCN60    STO 5
MPY   :  GO TO ARTH2    X
XNEY  :  SELECT ROM 5   x/y
G     :  GO TO FCN50    g
RUP   :  GO TO RUP1     R↑
RCL   :  GO TO FCN50    RCL
STO   :  GO TO FCN50    STO
FI    :  GO TO FCN50    f-1
RDN   :  GO TO RDN1     R↓
F     :  GO TO FCN50    f
RCL8  :  GO TO FCN60    RCL 8
RCL7  :  GO TO FCN60    RCL 7
EXCG  :  GO TO EXCG0    x≠y
DIG6  :  SELECT ROM 5   6
DIG5  :  SELECT ROM 5   5
DIG4  :  SELECT ROM 5   4
RCL6  :  GO TO FCN60    RCL 6
PLS   :  GO TO ARTH1    +
RCL4  :  GO TO FCN60    RCL 4
E     :  GO TO FCN40    E
XEQY  :  SELECT ROM 5   x=y
D     :  GO TO FCN40    D
C     :  GO TO FCN40    C
B     :  GO TO FCN40    B
RCL5  :  GO TO FCN60    RCL 5
A     :  GO TO FCN40    A
RCL3  :  GO TO FCN60    RCL 3
RCL2  :  GO TO FCN60    RCL 2
```

| | | | | | | | |
|---|---|---|---|---|---|---|---|
| 33 | L02041: | 1111....11 | -> L2360 | | RCL1 : | GO TO FCN60 | RCL 1 |
| 34 | L02042: | .1.....111 | -> L2101 | | DATA : | GO TO DATA0 | R/S |
| 35 | L02043: | 1.111..111 | -> L2271 | | DEC : | GO TO DEC0 | |
| 36 | L02044: | 1.1..1.... | -> L5045 | ***** | DIG0 : | SELECT ROM 5 | 0 |
| 37 | L02045: | 1111....11 | -> L2360 | | STO7 : | GO TO FCN60 | STO 7 |
| 38 | L02046: | 11...11111 | -> L2307 | | DVD : | GO TO ARTH3 | ÷ |
| 39 | L02047: | ..1...1... | -> L1050 | ***** | ENTR2 : | SELECT ROM 1 | |
| 40 | L02050: | 111..11111 | -> L2347 | | SST : | GO TO FCN50 | SST |
| 41 | L02051: | 1..1..1.... | -> L5052 | ***** | XGTY : | SELECT ROM 5 | x>y |
| 42 | L02052: | 111..11111 | -> L2347 | | RTN : | GO TO FCN50 | RTN |
| 43 | L02053: | 111..11111 | -> L2347 | | LBL : | GO TO FCN50 | LBL |
| 44 | L02054: | 111..11111 | -> L2347 | | GTO : | GO TO FCN50 | GTO |
| 45 | L02055: | 1111....11 | -> L2360 | | STO5 : | GO TO FCN60 | STO 5 |
| 46 | L02056: | 111..11111 | -> L2347 | | DSP : | GO TO FCN50 | DSP |
| 47 | L02057: | 1111....11 | -> L2360 | | STO3 : | GO TO FCN60 | STO 3 |
| 48 | L02060: | 1111....11 | -> L2360 | | STO2 : | GO TO FCN60 | STO 2 |
| 49 | L02061: | 1111....11 | -> L2360 | | STO1 : | GO TO FCN60 | STO 1 |
| 50 | L02062: | 1.1..1.... | -> L5063 | ***** | DIG9 : | SELECT ROM 5 | 9 |
| 51 | L02063: | 1.1..1.... | -> L5064 | ***** | DIG8 : | SELECT ROM 5 | 8 |
| 52 | L02064: | 1.1..1.... | -> L5065 | ***** | DIG7 : | SELECT ROM 5 | 7 |
| 53 | L02065: | 1111....11 | -> L2360 | | STO8 : | GO TO FCN60 | STO 8 |
| 54 | L02066: | 11..1.1.11 | -> L2312 | | MNS : | GO TO ARTH0 | - |
| 55 | L02067: | 1.1..1.... | -> L5070 | ***** | XLEY : | SELECT ROM 5 | x≤y |
| 56 | L02070: | 1..111..11 | -> L2234 | | CLX : | GO TO CLR10 | CLX |
| 57 | L02071: | .......... | | | | NO OPERATION | |
| 58 | L02072: | 1.11111111 | -> L2277 | | EEX : | GO TO EEX0 | EEX |
| 59 | L02073: | 111111.111 | -> L2375 | | CHS : | GO TO CHS0 | CHS |
| 60 | L02074: | .....1.... | -> L0075 | ***** | LSTX : | SELECT ROM 0 | LSTX |
| 61 | L02075: | .......... | | | | NO OPERATION | |
| 62 | L02076: | ...1..1111 | -> L2047 | | ENTR : | GO TO ENTR2 | ENTER↑ |
| 63 | L02077: | ..1.1.1... | | | MRK : | C EXCHANGE M | |
| 64 | L02100: | 1...111111 | -> L2217 | | | GO TO BNDS3 | |
| 65 | L02101: | ..11...11. | | | DATA0 : | 0 -> C[M] | |
| 66 | L02102: | 1.1..11.1.. | | ##### | | DELAYED SELECT GROUP 1 | |
| 67 | L02103: | ...1.1.1... | | | ENTR1 : | C EXCHANGE M | |
| 68 | L02104: | .1..1.1... | | | | C -> STACK | |
| 69 | L02105: | 1..1111111 | -> L2237 | | | GO TO CLR23 | |
| 70 | L02106: | 111.11..11 | -> L2354 | | | GO TO DATA6 | |
| 71 | L02107: | 1.1..1..1. | | | DEN7 : | SHIFT RIGHT B[WP] | |
| 72 | L02110: | .11.111..1 | -> L2156 | | | JSB DEN5 | |
| 73 | L02111: | 1..1....11 | -> L2220 | | | GO TO SDGT9 | |
| 74 | L02112: | ...1.1.1.. | | | DEN13 : | IF S1 # 1 | |
| 75 | L02113: | 1.1..1.111 | -> L2245 | | | THEN GO TO DEN12 | |
| 76 | L02114: | .111.1.1.. | | | | IF S7 # 1 | |
| 77 | L02115: | .1.11...11 | -> L2130 | | | THEN GO TO DEN9 | |
| 78 | L02116: | 111.1.1.1. | | | | A EXCHANGE C[X] | |
| 79 | L02117: | 1.11...111. | | | | SHIFT RIGHT A[W] | |
| 80 | L02120: | ....1..11.. | | | | 1 -> P | |
| 81 | L02121: | .11..1..1. | | | | C -> A[WP] | |
| 82 | L02122: | .11.111111 | -> L2157 | | | GO TO DEN17 | |
| 83 | L02123: | .....11.1.. | | | CLSTS1: | CLEAR STATUS | |
| 84 | L02124: | .....11.... | | | | RETURN | |
| 85 | L02125: | .......... | | | | NO OPERATION | |
| 86 | L02126: | .......... | | | | NO OPERATION | |
| 87 | L02127: | 1.1...111. | | | DEN16 : | SHIFT RIGHT B[W] | |
| 88 | L02130: | 1...1.111. | | | DEN9 : | B EXCHANGE C[W] | |
| 89 | L02131: | .1111.111. | | | | C + 1 -> C[W] | |
| 90 | L02132: | ......11.. | | | | 0 -> P | |
| 91 | L02133: | ...11...1. | | | DEN3 : | IF C[P] >= 1 | |
| 92 | L02134: | .11.1..111 | -> L2151 | | | THEN GO TO DEN2 | |
| 93 | L02135: | ....1111.. | | | | P + 1 -> P | |
| 94 | L02136: | .1...1..1. | | | | SHIFT LEFT A[WP] | |
| 95 | L02137: | .1.11.1111 | -> L2133 | | | GO TO DEN3 | |
| 96 | L02140: | ..1..1.1... | | | CHS1 : | C EXCHANGE M | |
| 97 | L02141: | 1.11..111. | | | | SHIFT RIGHT A[W] | |
| 98 | L02142: | .111.1.1.. | | | | IF S7 # 1 | |
| 99 | L02143: | 1...1.11111 | -> L2227 | | | THEN GO TO CHS2 | |
| 100 | L02144: | 111.1.1.1. | | | | A EXCHANGE C[X] | |
| 101 | L02145: | ..11111.1. | | | | 0 - C - 1 -> C[XS] | |
| 102 | L02146: | 111.1.1.1. | | | | A EXCHANGE C[X] | |
| 103 | L02147: | .11.111111 | -> L2157 | | | GO TO DEN17 | |
| 104 | L02150: | 1..1..1... | -> L5151 | ***** | ARTH4 : | SELECT ROM 5 | |
| 105 | L02151: | .1.11.111. | | | DEN2 : | C - 1 -> C[W] | |
| 106 | L02152: | 1...1.111. | | | | B EXCHANGE C[W] | |
| 107 | L02153: | ..111.11.. | | | | IF P # 3 | |
| 108 | L02154: | 1111.11.11 | -> L2366 | | | THEN GO TO DEN4 | |

| | | | |
|---|---|---|---|
|109|L02155:|1.1111..1.||
|110|L02156:|1.11.1.11.||
|111|L02157:|.11..1111.||
|112|L02160:|.111.1.1.||
|113|L02161:|.111..1111|-> L2163|
|114|L02162:|....1.1.1.||
|115|L02163:|1...1...1..||
|116|L02164:|.1111.....||
|117|L02165:|...1.1.....||
|118|L02166:|...1..1....|-> L1167 *****|
|119|L02167:|1....1.1..||
|120|L02170:|.1.1..1111|-> L2123|
|121|L02171:|....11.1..||
|122|L02172:|1.....1..1.||
|123|L02173:|....11....||
|124|L02174:|.111.111.1|-> L2167|
|125|L02175:|...1..1....|-> L1176 *****|
|126|L02176:|.11.111.1.||
|127|L02177:|11.111..11|-> L2334|
|128|L02200:|.111111.1.||
|129|L02201:|.11.111.1.||
|130|L02202:|11.11..111|-> L2331|
|131|L02203:|.111111.1.||
|132|L02204:|.11.111.1.||
|133|L02205:|111.1.1.11|-> L2352|
|134|L02206:|...11...11.||
|135|L02207:|...11..1.1.||
|136|L02210:|.1.11..11.||
|137|L02211:|.1.11.1.1.||
|138|L02212:|1..1..1.1.||
|139|L02213:|....11.1..||
|140|L02214:|1.11.11.11|-> L2266|
|141|L02215:|...1.1.1..||
|142|L02216:|111..1.111|-> L2345|
|143|L02217:|..1..1.1..|-> L1220 *****|
|144|L02220:|.111.111.1|-> L2167|
|145|L02221:|..11..11..||
|146|L02222:|1.1..1....|-> L5223 *****|
|147|L02223:|....11.1..||
|148|L02224:|1.....1...||
|149|L02225:|1.1....1..||
|150|L02226:|1...111111|-> L2217|
|151|L02227:|..1111111.||
|152|L02230:|.11..1111.||
|153|L02231:|.1111.....||
|154|L02232:|1..1....1.||
|155|L02233:|.111111.11|-> L2176|
|156|L02234:|..11...11.||
|157|L02235:|..1.1.1...||
|158|L02236:|..11..111.||
|159|L02237:|...111.....||
|160|L02240:|.111.111.1|-> L2167|
|161|L02241:|11.111..11|-> L2334|
|162|L02242:|...11...11.||
|163|L02243:|..1.1.1...||
|164|L02244:|1.1.....11|-> L2240|
|165|L02245:|1.111..1..||
|166|L02246:|...111.....||
|167|L02247:|1.11.1.1..||
|168|L02250:|1.1.1.1.11|-> L2252|
|169|L02251:|.1...1.1..||
|170|L02252:|..11..111.||
|171|L02253:|11......11..||
|172|L02254:|.1.111..1.||
|173|L02255:|.11111111.||
|174|L02256:|.11111111.||
|175|L02257:|1...1.111.||
|176|L02260:|..11..111.||
|177|L02261:|...1..1.1..||
|178|L02262:|.1.1.11111|-> L2127|
|179|L02263:|.1.11...11|-> L2130|
|180|L02264:|1..1.1.1..||
|181|L02265:|1..1..1111|-> L2223|
|182|L02266:|.11.1.....||
|183|L02267:|1.1.....11|-> L2240|
|184|L02270:|...1..1....|-> L1271 *****|

```
                    0 -> A[WP]
         DEN5   :   SHIFT RIGHT A[MS]
         DEN17  :   C -> A[S]
         DEN15  :   IF S7 # 1
                       THEN GO TO DEN14
                    0 -> B[X]
         DEN14  :   1 -> S9
                    0 -> F3
                    1 -> F1
                    SELECT ROM 1
         CLSTS0 :   IF S8 # 1
                       THEN GO TO CLSTS1
                    CLEAR STATUS
                    1 -> S8
                    RETURN
                    JSB CLSTS0
                    SELECT ROM 1
         BNDS0  :   IF C[XS] = 0
                       THEN GO TO BNDS5
                    C + 1 -> C[XS]
                    IF C[XS] = 0
                       THEN GO TO BNDS2
                    C + 1 -> C[XS]
                    IF C[XS] = 0
                       THEN GO TO UFLW
         OFLW   :   0 -> C[M]
                    0 -> C[X]
                    C - 1 -> C[M]
                    C - 1 -> C[X]
                    SHIFT RIGHT C[X]
         BNDS4  :   CLEAR STATUS
                    GO TO BNDS5
         RDN1   :   C EXCHANGE M
                    GO TO ROLL1
         BNDS3  :   SELECT ROM 1
         SDGT9  :   JSB CLSTS0
                    3 -> P
                    SELECT ROM 5
         DATA2  :   CLEAR STATUS
                    1 -> S8
                    1 -> S10
                    GO TO BNDS3
         CHS2   :   0 - C - 1 -> C[S]
                    C -> A[S]
                    0 -> F3
                    1 -> S9
                    GO TO BNDS0
         CLR10  :   0 -> C[M]
         CLR11  :   C EXCHANGE M
                    0 -> C[W]
         CLR23  :   0 -> F1
         CLR24  :   JSB CLSTS0
                    GO TO BNDS5
         NOOP1  :   0 -> C[M]
                    C EXCHANGE M
                    GO TO CLR24
         DEN12  :   0 -> S11
                    0 -> F1
                    IF S11 # 1
                       THEN GO TO RSET2
                    C -> STACK
         RSET2  :   0 -> C[W]
                    12 -> P
                    C - 1 -> C[WP]
                    C + 1 -> C[S]
                    C + 1 -> C[S]
                    B EXCHANGE C[W]
                    0 -> C[W]
                    IF S2 # 1
                       THEN GO TO DEN16
                    GO TO DEN9
         DATA1  :   IF S9 # 1
                       THEN GO TO DATA2
         BNDS6  :   1 -> F3
                    GO TO CLR24
         DEC2   :   SELECT ROM 1
```

```
185   L02271:  ...11..11.
186   L02272:  1.111..11  -> L2270
187   L02273:  ..1....1..
188   L02274:  ...1.1.1..
189   L02275:  ..1..1.11  -> L2044
190   L02276:  11...1..11 -> L2304
191   L02277:  ...11..11.
192   L02300:  ..1..11111 -> L2047
193   L02301:  .111...1..
194   L02302:  ...1.1.1..
195   L02303:  .....1..11 -> L2004
196   L02304:  ..1.1.1...
197   L02305:  1.11..111.
198   L02306:  .11.1111.1 -> L2157
199   L02307:  11111.1.1.
200   L02310:  11111.1.1.
201   L02311:  11111.1.1.
202   L02312:  .111.111.1 -> L2167
203   L02313:  .11.1..11.
204   L02314:  .11.1...11 -> L2150
205   L02315:  1....1....  -> L4316
206   L02316:  ..11.1....
207   L02317:  ..........
208   L02320:  ..11......
209   L02321:  .111111.11 -> L2176
210   L02322:  ..1.1.1...
211   L02323:  .11.1.1...
212   L02324:  .1.1.1.1..
213   L02325:  111.1.111.
214   L02326:  ...1.1....
215   L02327:  .111.111.1 -> L2167
216   L02330:  .111111.11 -> L2176
217   L02331:  .11.1.1.1.
218   L02332:  111.1.1.11 -> L2352
219   L02333:  .1.1111.1.
220   L02334:  ...11..11.
221   L02335:  11.1111111 -> L2337
222   L02336:  ..11..111.
223   L02337:  111.1.11..
224   L02340:  1...111111 -> L2217
225   L02341:  .....1....  -> L0342
226   L02342:  ..1.1.1...
227   L02343:  11..1.1...
228   L02344:  11..1.1...
229   L02345:  11..1.1...
230   L02346:  11.1.11.11 -> L2326
231   L02347:  1....1....  -> L4350
232   L02350:  11.1.11111 -> L2327
233   L02351:  1....1....  -> L4352
234   L02352:  ..11..111.
235   L02353:  1...1.11.1 -> L2213
236   L02354:  ...1.1.1..
237   L02355:  1...1.1111 -> L2213
238   L02356:  ..111.....
239   L02357:  1...1.1111 -> L2213
240   L02360:  .....1....  -> L0361
241   L02361:  .1....111.
242   L02362:  ...1...1..
243   L02363:  .11.111.11 -> L2156
244   L02364:  ...1......
245   L02365:  ........11 -> L2000
246   L02366:  ...1.1.1..
247   L02367:  1111...111 -> L2361
248   L02370:  ..1..1.1..
249   L02371:  .1...11111 -> L2107
250   L02372:  .....111..
251   L02373:  .....1..1.
252   L02374:  .11.111..1 -> L2156
253   L02375:  .11.1..11.
254   L02376:  .11.....11 -> L2140
255   L02377:  ..1..11111 -> L2047
```

```
DEC0  :  IF C[M] >= 1
             THEN GO TO DEC2
DEC1  :  1 -> S2
         IF S1 # 1
             THEN GO TO DIG0
         GO TO EEX1
EEX0  :  IF C[M] >= 1
             THEN GO TO ENTR2
EEX2  :  1 -> S7
         IF S1 # 1
             THEN GO TO DIG1
EEX1  :  C EXCHANGE M
         SHIFT RIGHT A[W]
         JSB DEN17
ARTH3 :  A + 1 -> A[X]
ARTH2 :  A + 1 -> A[X]
ARTH1 :  A + 1 -> A[X]
ARTH0 :  JSB CLSTS0
         IF C[M] = 0
             THEN GO TO ARTH4
         SELECT ROM 4
*****    KEYS -> ROM ADDRESS
         NO OPERATION
ERR3  :  1 -> F3
         GO TO BNDS0
EXCG0 :  C EXCHANGE M
         STACK -> A
         C -> STACK
         A EXCHANGE C[W]
FRTN1 :  1 -> F1
FRTN2 :  JSB CLSTS0
         GO TO BNDS0
BNDS2 :  IF C[X] = 0
             THEN GO TO UFLW
         C - 1 -> C[XS]
BNDS5 :  IF C[M] >= 1
             THEN GO TO BNDS7
         0 -> C[W]
BNDS7 :  IF P # 14
             THEN GO TO BNDS3
         SELECT ROM 0
RUP1  :  C EXCHANGE M
         DOWN ROTATE
         DOWN ROTATE
ROLL1 :  DOWN ROTATE
         GO TO FRTN1
*****  FCN50 :  SELECT ROM 4
                GO TO FRTN2
*****  FCN40 :  SELECT ROM 4
UFLW  :  0 -> C[W]
         JSB BNDS4
DATA6 :  IF S1 # 1
             THEN GO TO BNDS4
         0 -> F1
         GO TO BNDS4
*****  FCN60 :  SELECT ROM 0
DEN6  :  SHIFT LEFT A[W]
         1 -> S1
         GO TO DEN5
         BUFFER -> ROM ADDRESS
         GO TO NOOP
DEN4  :  IF S1 # 1
             THEN GO TO DEN6
         IF S2 # 1
             THEN GO TO DEN7
         P - 1 -> P
         0 -> B[P]
         JSB DEN5
CHS0  :  IF C[M] = 0
             THEN GO TO CHS1
         GO TO ENTR2
```

ROM03 OBJECT PROGRAM

```
 0    L03000:   .1.11.1.1.
 1    L03001:   .1.11.1.1.
 2    L03002:   .11...111.
 3    L03003:   ..1...1..1    -> L3042
 4    L03004:   ..1...1...    -> L1005
 5    L03005:   ...1111..11   -> L3074
 6    L03006:   ..........
 7    L03007:   ..........
 8    L03010:   11...1....    -> L6011
 9    L03011:   1.1.1..1..
10    L03012:   11...11...
11    L03013:   ..11..111.
12    L03014:   ...1.11...
13    L03015:   .1.1.11...
14    L03016:   .111.11...
15    L03017:   .....11...
16    L03020:   .111.11...
17    L03021:   1..1.11...
18    L03022:   .11..11...
19    L03023:   ...11.11...
20    L03024:   ..1..11...
21    L03025:   .111.11...
22    L03026:   11....11..
23    L03027:   ....11....
24    L03030:   11...1....    -> L6031
25    L03031:   .1...1.1..
26    L03032:   ...11...11    -> L3030
27    L03033:   1.1.11.1..
28    L03034:   ..1...1...    -> L1035
29    L03035:   11.11...1.
30    L03036:   ........11    -> L3000
31    L03037:   .1.11.1.1.
32    L03040:   11..1111.1    -> L3317
33    L03041:   1.1..1.1.1    -> L3245
34    L03042:   ....1.1..1    -> L3012
35    L03043:   1.1..1...1    -> L3244
36    L03044:   11.1111.11    -> L3336
37    L03045:   .1.11.1.1.
38    L03046:   11..111..1    -> L3316
39    L03047:   1.1..1...1    -> L3244
40    L03050:   .1.11...11    -> L3130
41    L03051:   1.....1..1    -> L3202
42    L03052:   1.1.11.1..
43    L03053:   .1...1....    -> L2054
44    L03054:   11...1....    -> L6055
45    L03055:   1111111.1.
46    L03056:   1......111    -> L3201
47    L03057:   .11.1.1.11    -> L3152
48    L03060:   .11...111.
49    L03061:   ...1.1.1..
50    L03062:   ..1..11..1    -> L3054
51    L03063:   1111..1..1    -> L3362
52    L03064:   .111.1.1..
53    L03065:   .11.....11    -> L3140
54    L03066:   111...1111    -> L3343
55    L03067:   ..........
56    L03070:   .11...111.
57    L03071:   11...1....    -> L6072
58    L03072:   1111..1..1    -> L3362
59    L03073:   111...1111    -> L3343
60    L03074:   1.1.....1..
61    L03075:   11....11..
62    L03076:   1..1.1.1.1    -> L3245
63    L03077:   .11..1.1..
64    L03100:   1.1.111.11    -> L3256
65    L03101:   .11.1..1..
66    L03102:   .11.1.1...
67    L03103:   .1..1.1...
68    L03104:   111.1.111.
69    L03105:   .1.....1..
70    L03106:   ..11..11.11   -> L3154
71    L03107:   1.1..111.1    -> L3247
72    L03110:   11.11....1.
73    L03111:   11.1.11111    -> L3327
```

```
              FMOD3 :  C - 1 -> C[X]
                       C - 1 -> C[X]
                       C -> A[W]
                       JSB FMOD4
*****  FDGT8 :  SELECT ROM 1
                GO TO DMST2
                NO OPERATION
                NO OPERATION
*****  TANX  :  SELECT ROM 6
       PI21  :  0 -> S10
       PI20  :  12 -> P
                0 -> C[W]
                LOAD CONSTANT 1
                LOAD CONSTANT 5
                LOAD CONSTANT 7
                LOAD CONSTANT 0
                LOAD CONSTANT 7
                LOAD CONSTANT 9
                LOAD CONSTANT 6
                LOAD CONSTANT 3
                LOAD CONSTANT 2
                LOAD CONSTANT 7
                12 -> P
                RETURN
               SELECT ROM 6
               IF S4 # 1
                 THEN GO TO RET
DELAYED SELECT GROUP 1
               SELECT ROM 1
*****  FMOD1 : A - 1 -> A[P]
               IF NO CARRY GO TO FMOD3
               C - 1 -> C[X]
               JSB LD90
               JSB DVD30
       FMOD4 : JSB PI20
               JSB MPY30
               GO TO FMOD2
       TDMS3 : C - 1 -> C[X]
               JSB LD91
               JSB MPY30
               GO TO TDMS2
       DOCT0 : JSB INT6
DELAYED SELECT GROUP 1
*****          SELECT ROM 2
*****  SQT2  : SELECT ROM 6
       FIDGT7: A + 1 -> A[XS]
               IF NO CARRY GO TO FIDGT8
               GO TO DMSM0
               C -> A[W]
               IF S1 # 1
                 THEN GO TO SQT2
               JSB ADR9
               IF S7 # 1
                 THEN GO TO FMOD0
               GO TO MAG0
               NO OPERATION
       SIN12 : C -> A[W]
               SELECT ROM 6
*****          JSB ADR9
               GO TO MAG0
       DMST2 : 1 -> S10
               12 -> P
               JSB DVD30
               IF S6 # 1
                 THEN GO TO DMST5
               0 -> S6
               STACK -> A
               C -> STACK
               A EXCHANGE C[W]
               1 -> S4
               GO TO DMST0
       DMST6 : JSB MOD10
               A - 1 -> A[P]
               IF NO CARRY GO TO DMST3
```

| | | | |
|---|---|---|---|
| 74 | L03112: | .1.11.1.1. | |
| 75 | L03113: | 11..111..1 | -> L3316 |
| 76 | L03114: | 1.1..1.1.1 | -> L3245 |
| 77 | L03115: | ....1..1.1 | -> L3011 |
| 78 | L03116: | 1.1..1..11 | -> L3244 |
| 79 | L03117: | 1111...1.1 | -> L3361 |
| 80 | L03120: | 1.1..1...1 | -> L3244 |
| 81 | L03121: | 1.11111... | |
| 82 | L03122: | 1...1..1.1 | -> L3211 |
| 83 | L03123: | 1.1.11.1.. | |
| 84 | L03124: | ..1..1.... | -> L1125 |
| 85 | L03125: | .......... | |
| 86 | L03126: | 11.11...1. | |
| 87 | L03127: | ..1..1.111 | -> L3045 |
| 88 | L03130: | 1.1..1.1.. | |
| 89 | L03131: | ..1..1..1. | -> L1132 |
| 90 | L03132: | 1.....1..1 | -> L3202 |
| 91 | L03133: | 11.1.1.111 | -> L3325 |
| 92 | L03134: | .1111.1.1. | |
| 93 | L03135: | 11..1111.1 | -> L3317 |
| 94 | L03136: | 1.1.1..1.. | |
| 95 | L03137: | 1.1..1.111 | -> L3245 |
| 96 | L03140: | 1.1..111.1 | -> L3247 |
| 97 | L03141: | 11.11...1. | |
| 98 | L03142: | ...111.111 | -> L3035 |
| 99 | L03143: | 11.1111.11 | -> L3336 |
| 100 | L03144: | .......... | |
| 101 | L03145: | ..11..111. | |
| 102 | L03146: | .1111...1. | |
| 103 | L03147: | .111.1.1.. | |
| 104 | L03150: | ....1...11 | -> L3010 |
| 105 | L03151: | 11...1.... | -> L6152 |
| 106 | L03152: | ..1111111. | |
| 107 | L03153: | .11.....1.. | |
| 108 | L03154: | 1.1.11.1.. | |
| 109 | L03155: | ..1..1.... | -> L1156 |
| 110 | L03156: | .1111..1.. | |
| 111 | L03157: | 1111111.1. | |
| 112 | L03160: | ..1.11.111 | -> L3055 |
| 113 | L03161: | .11.11..11 | -> L3154 |
| 114 | L03162: | 1.....1..1 | -> L3202 |
| 115 | L03163: | 1.1.11.1.. | |
| 116 | L03164: | .1....1... | -> L2165 |
| 117 | L03165: | 11...1.... | -> L6166 |
| 118 | L03166: | .11..1.1.. | |
| 119 | L03167: | 1.111.1.11 | -> L3272 |
| 120 | L03170: | 11..11.111 | -> L3315 |
| 121 | L03171: | .1.11.1.1. | |
| 122 | L03172: | .....111.. | |
| 123 | L03173: | ...11.1.1. | |
| 124 | L03174: | 1..1.1..11 | -> L3224 |
| 125 | L03175: | ..11.1..1. | |
| 126 | L03176: | 111.1.1.1. | |
| 127 | L03177: | .11...1.1. | |
| 128 | L03200: | 1....11111 | -> L3207 |
| 129 | L03201: | ..1..1.... | -> L1202 |
| 130 | L03202: | 11....1.11 | |
| 131 | L03203: | .11...111. | |
| 132 | L03204: | .11.111.1. | |
| 133 | L03205: | .1111.1.11 | -> L3172 |
| 134 | L03206: | ..11..111. | |
| 135 | L03207: | .....11.... | |
| 136 | L03210: | ...11.1111 | |
| 137 | L03211: | 1.1..1.... | -> L5212 |
| 138 | L03212: | 1.11.11.11 | -> L3266 |
| 139 | L03213: | 1111111.1. | |
| 140 | L03214: | .....1..11 | -> L3004 |
| 141 | L03215: | .11.1.1111 | -> L3153 |
| 142 | L03216: | ..1..1.111 | -> L3051 |
| 143 | L03217: | ..1....1.. | -> L1220 |
| 144 | L03220: | .1111.1.1. | |
| 145 | L03221: | .1111.1.1. | |
| 146 | L03222: | .11...111. | |
| 147 | L03223: | 111111.1.1 | -> L3375 |
| 148 | L03224: | ..1.1.11.. | |
| 149 | L03225: | .1111..111 | -> L3171 |

```
                          C - 1 -> C[X]
                          JSB LD91
                          JSB DVD30
                          JSB PI21
                          GO TO MPY30
           RTP9  :        JSB RTP13
                          JSB MPY30
                          DATA -> C
                          JSB ADD10
 #####                    DELAYED SELECT GROUP 1
 *****                    SELECT ROM 1
                          NO OPERATION
           TDMS1 :        A - 1 -> A[P]
                          IF NO CARRY GO TO TDMS3
 #####     TDMS2 :        DELAYED SELECT GROUP 1
 *****                    SELECT ROM 1
           INT0  :        JSB INT6
                          GO TO FRTN14
           DMST4 :        C + 1 -> C[X]
                          JSB LD90
                          0 -> S10
                          GO TO DVD30
           FMOD0 :        JSB MOD10
                          A - 1 -> A[P]
                          IF NO CARRY GO TO FMOD1
                          GO TO FMOD2
                          NO OPERATION
           MAG4  :        0 -> C[W]
                          C + 1 -> C[P]
                          IF S7 # 1
                               THEN GO TO TANX
 *****                    SELECT ROM 6
           .DMSM0 :       0 - C - 1 -> C[S]
           DMSP0 :        1 -> S6
 #####     DMST0 :        DELAYED SELECT GROUP 1
 *****                    SELECT ROM 1
           FIDGT6:        0 -> S7
                          A + 1 -> A[XS]
                          IF NO CARRY GO TO FIDGT7
                          GO TO DMST0
           ODEC0 :        JSB INT6
 #####                    DELAYED SELECT GROUP 1
 *****                    SELECT ROM 2
 *****     LPI11 :        SELECT ROM 6
                          IF S6 # 1
                               THEN GO TO RMOD0
                          GO TO RTP3
           INT4  :        C - 1 -> C[X]
           INT2  :        P - 1 -> P
                          IF C[X] >= 1
                               THEN GO TO INT3
           INT5  :        0 -> C[WP]
                          A EXCHANGE C[X]
                          C -> A[X]
                          GO TO INT7
 *****     FIDGT8:        SELECT ROM 1
           INT6  :        12 -> P
                          C -> A[W]
                          IF C[XS] = 0
                               THEN GO TO INT2
                          0 -> C[W]
           INT7  :        RETURN
           SUB10 :        0 - C - 1 -> C[S]
 *****     ADD10 :        SELECT ROM 5
                          GO TO FACT0
           FDGT7 :        A + 1 -> A[XS]
                          IF NO CARRY GO TO FDGT8
                          GO TO DMSP0
                          GO TO DOCT0
 *****     WAIT50:        SELECT ROM 1
           RMOD3 :        C + 1 -> C[X]
                          C + 1 -> C[X]
                          C -> A[W]
                          JSB RMOD5
           INT3  :        IF P # 2
                               THEN GO TO INT4
```

| | | | | | |
|---|---|---|---|---|---|
| 150 | L03226: | .11111.111 | -> L3175 | | GO TO INT5 |
| 151 | L03227: | 1.1.11.1.. | | ##### PTR3 : | DELAYED SELECT GROUP 1 |
| 152 | L03230: | ...1..1... | -> L1231 | ***** | SELECT ROM 1 |
| 153 | L03231: | 1111111.1. | | FDGT6 : | A + 1 -> A[XS] |
| 154 | L03232: | 1...1.1111 | -> L3213 | | IF NO CARRY GO TO FDGT7 |
| 155 | L03233: | 1.1..111.1 | -> L3247 | TDMS0 : | JSB MOD10 |
| 156 | L03234: | 11.11...1. | | | A - 1 -> A[P] |
| 157 | L03235: | .1.1.11.11 | -> L3126 | | IF NO CARRY GO TO TDMS1 |
| 158 | L03236: | .1111.1.1. | | | C + 1 -> C[X] |
| 159 | L03237: | 11..111..1 | -> L3316 | | JSB LD91 |
| 160 | L03240: | 1.1..1...1 | -> L3244 | | JSB MPY30 |
| 161 | L03241: | ....1.1..1 | -> L3012 | | JSB PI20 |
| 162 | L03242: | 1.1..1.1.1 | -> L3245 | | JSB DVD30 |
| 163 | L03243: | .1.11...11 | -> L3130 | | GO TO TDMS2 |
| 164 | L03244: | 11...1.... | -> L6245 | ***** MPY30 : | SELECT ROM 6 |
| 165 | L03245: | 11...1.... | -> L6246 | ***** DVD30 : | SELECT ROM 6 |
| 166 | L03246: | 111.1.111. | | MOD11 : | A EXCHANGE C[W] |
| 167 | L03247: | ..1.1.1... | | MOD10 : | C EXCHANGE M |
| 168 | L03250: | .11..11.1. | | | C -> A[X] |
| 169 | L03251: | ..1.1.1... | | | C EXCHANGE M |
| 170 | L03252: | ......11.. | | | 0 -> P |
| 171 | L03253: | ...11..1.. | | | 0 -> S1 |
| 172 | L03254: | 1.1.....1.. | | | 1 -> S10 |
| 173 | L03255: | ....11.... | | | RETURN |
| 174 | L03256: | .1...1.1.. | | DMST5 : | IF S4 # 1 |
| 175 | L03257: | .1...11111 | -> L3107 | | THEN GO TO DMST6 |
| 176 | L03260: | .1...1.1.. | | | 0 -> S4 |
| 177 | L03261: | 1.1.....1.. | | | 1 -> S10 |
| 178 | L03262: | .11.1.1... | | | STACK -> A |
| 179 | L03263: | 11....11.. | | | 12 -> P |
| 180 | L03264: | 1...1..1.1 | -> L3211 | | JSB ADD10 |
| 181 | L03265: | .1.11...11 | -> L3130 | | GO TO TDMS2 |
| 182 | L03266: | 1.....1..1 | -> L3202 | FACT0 : | JSB INT6 |
| 183 | L03267: | 1.1.11.1.. | | ##### | DELAYED SELECT GROUP 1 |
| 184 | L03270: | .....1.... | -> L0271 | ***** | SELECT ROM 0 |
| 185 | L03271: | 1...1....1 | -> L3210 | RTP5 : | JSB SUB10 |
| 186 | L03272: | 1.1..11..1 | -> L3246 | RMOD0 : | JSB MOD11 |
| 187 | L03273: | 11.11...1. | | | A - 1 -> A[P] |
| 188 | L03274: | 11111...11 | -> L3370 | | IF NO CARRY GO TO RMOD2 |
| 189 | L03275: | .11...1.1.. | | RMOD6 : | IF S6 # 1 |
| 190 | L03276: | 11.1.1.111 | -> L3325 | | THEN GO TO FRTN14 |
| 191 | L03277: | 1.1.11.1.. | | ##### | DELAYED SELECT GROUP 1 |
| 192 | L03300: | ..1..1.... | -> L1301 | ***** | SELECT ROM 1 |
| 193 | L03301: | 1.1..1.1.1 | -> L3245 | PTR2 : | JSB DVD30 |
| 194 | L03302: | .11.1.1... | | | STACK -> A |
| 195 | L03303: | .1...1.1.. | | | C -> STACK |
| 196 | L03304: | 1..1..1..1 | -> L3244 | | JSB MPY30 |
| 197 | L03305: | 1...1.1111 | -> L3227 | | GO TO PTR3 |
| 198 | L03306: | .111..1.11 | -> L3162 | | GO TO ODEC0 |
| 199 | L03307: | 1.....1..1 | -> L3202 | FRAC0 : | JSB INT6 |
| 200 | L03310: | .....1..1. | -> L0311 | ***** | SELECT ROM 0 |
| 201 | L03311: | .....1.... | -> L0312 | ***** NOSFX4 : | SELECT ROM 0 |
| 202 | L03312: | 1.1..1...1 | -> L3244 | | JSB MPY30 |
| 203 | L03313: | 1.1.11.1.. | | ##### | DELAYED SELECT GROUP 1 |
| 204 | L03314: | ..1..1.... | -> L1315 | ***** | SELECT ROM 1 |
| 205 | L03315: | ..1..1.... | -> L1316 | ***** RTP3 : | SELECT ROM 1 |
| 206 | L03316: | 1.1.....1.. | | LD91 : | 1 -> S10 |
| 207 | L03317: | .11....111 | | LD90 : | C -> A[W] |
| 208 | L03320: | 11.....11. | | | 12 -> P |
| 209 | L03321: | ..11..111. | | | 0 -> C[W] |
| 210 | L03322: | .1.11...1. | | | C - 1 -> C[P] |
| 211 | L03323: | ....11.... | | | RETURN |
| 212 | L03324: | .1..111111 | -> L3117 | | GO TO RTP9 |
| 213 | L03325: | .1...1.... | -> L2326 | ***** FRTN14 : | SELECT ROM 2 |
| 214 | L03326: | .1...1.... | -> L2327 | ***** FRTN13 : | SELECT ROM 2 |
| 215 | L03327: | 11.11...1. | | DMST3 : | A - 1 -> A[P] |
| 216 | L03330: | .1.11..11 | -> L3134 | | IF NO CARRY GO TO DMST4 |
| 217 | L03331: | 11.1.1.111 | -> L3325 | | GO TO FRTN14 |
| 218 | L03332: | 1.1..1.... | -> L5333 | ***** EXIT : | SELECT ROM 5 |
| 219 | L03333: | .1.1.1.1.. | | | IF S10 # 1 |
| 220 | L03334: | 11.11.1.11 | -> L3332 | | THEN GO TO EXIT |
| 221 | L03335: | ....11.... | | | RETURN |
| 222 | L03336: | .11...111. | | FMOD2 : | C -> A[W] |
| 223 | L03337: | ....1.111. | | | 0 -> B[W] |
| 224 | L03340: | 11....11.. | | | 12 -> P |
| 225 | L03341: | 1.1.1...1.. | | | 0 -> S10 |

```
226  L03342:  ...1...1..
227  L03343:  .111111.1.
228  L03344:  111.11.111   -> L3355
229  L03345:  .11.1.1.1.
230  L03346:  111.11.111   -> L3355
231  L03347:  ..11..111.
232  L03350:  ......11..
233  L03351:  .1.1.11...
234  L03352:  11.....11..
235  L03353:  .111..1.1.
236  L03354:  .11..1.111   -> L3145
237  L03355:  .111.1.1..
238  L03356:  .111.1.111   -> L3165
239  L03357:  111.1.111.
240  L03360:  ..111...11   -> L3070
241  L03361:  .11...111.
242  L03362:  1...1.111.
243  L03363:  .1.11...1.
244  L03364:  1..111....
245  L03365:  1...1.111.
246  L03366:  ....1.111.
247  L03367:  ...11.....
248  L03370:  11.11...1.
249  L03371:  1..1....11   -> L3220
250  L03372:  .1111.1.1.
251  L03373:  11..1111.1   -> L3317
252  L03374:  1.1..1...1   -> L3244
253  L03375:  ....1..1.1   -> L3012
254  L03376:  1..1.1.1.1   -> L3245
255  L03377:  1.1111.111   -> L3275

ROM04 OBJECT PROGRAM

0   L04000:  1.....1111   -> L4203           NOOP  :  GO TO FCN19
1   L04001:  ..........                               NO OPERATION
2   L04002:  1.1..1....   -> L5003   *****   DIG3  :  SELECT ROM 5
3   L04003:  1.1..1....   -> L5004   *****   DIG2  :  SELECT ROM 5
4   L04004:  1.1..1....   -> L5005   *****   DIG1  :  SELECT ROM 5
5   L04005:  1..11.1111   -> L4233                    GO TO PAD0
6   L04006:  1.....1111   -> L4203           MPY   :  GO TO FCN19
7   L04007:  1.....1111   -> L4203           XNEY  :  GO TO FCN19
8   L04010:  .11.11.111   -> L4155           G     :  GO TO P3
9   L04011:  1.....1111   -> L4203           RUP   :  GO TO FCN19
10  L04012:  .11.111.11   -> L4156           RCL   :  GO TO P4
11  L04013:  .11.111111   -> L4157           STO   :  GO TO P5
12  L04014:  .111....11   -> L4160           FI    :  GO TO P6
13  L04015:  1.....1111   -> L4203           RDN   :  GO TO FCN19
14  L04016:  .111...111   -> L4161           F     :  GO TO P7
15  L04017:  1.1.1.....                       FCN21 :  1 -> F5
16  L04020:  ..1..1..1.   -> L1021   *****   FCN2  :  SELECT ROM 1
17  L04021:  1.....1111   -> L4203           EXCG  :  GO TO FCN19
18  L04022:  1.1..1....   -> L5023   *****   DIG6  :  SELECT ROM 5
19  L04023:  1.1..1....   -> L5024   *****   DIG5  :  SELECT ROM 5
20  L04024:  1.1..1....   -> L5025   *****   DIG4  :  SELECT ROM 5
21  L04025:  ..........                               NO OPERATION
22  L04026:  1.....1111   -> L4203           PLS   :  GO TO FCN19
23  L04027:  1.11....11   -> L4260                    GO TO UFCN9
24  L04030:  1.....1111   -> L4203           E     :  GO TO FCN19
25  L04031:  1.....1111   -> L4203           XEQY  :  GO TO FCN19
26  L04032:  1.....1111   -> L4203           D     :  GO TO FCN19
27  L04033:  1.....1111   -> L4203           C     :  GO TO FCN19
28  L04034:  1.....1111   -> L4203           B     :  GO TO FCN19
29  L04035:  ..........                               NO OPERATION
30  L04036:  1.....1111   -> L4203           A     :  GO TO FCN19
31  L04037:  111.1.11..                       FCN27 :  IF P # 14
32  L04040:  1111..1111   -> L4363                       THEN GO TO FCN28
33  L04041:  ..1111...1   -> L4074                    JSB LSTX
34  L04042:  1.....1111   -> L4203           DATA  :  GO TO FCN19
35  L04043:  1.....1111   -> L4203           DEC   :  GO TO FCN19
36  L04044:  .1.1..1...   -> L5045   *****   DIG0  :  SELECT ROM 5
37  L04045:  .....1....   -> L0046   *****   UFCN10:  SELECT ROM 0
38  L04046:  1.....1111   -> L4203           DVD   :  GO TO FCN19
39  L04047:  ....11....                       RSETP :  RETURN
40  L04050:  .111..1111   -> L4163           SST   :  GO TO P8
41  L04051:  1.....1111   -> L4203           XGTY  :  GO TO FCN19
```

```
                 1 -> S1
MAG0    :   C + 1 -> C[XS]
            IF NO CARRY GO TO MAG3
            IF C[X] = 0
                THEN GO TO MAG3
            0 -> C[W]
            0 -> P
            LOAD CONSTANT 5
            12 -> P
            A + C -> C[X]
            IF NO CARRY GO TO MAG4
MAG3    :   IF S7 # 1
                THEN GO TO LPI11
            A EXCHANGE C[W]
            GO TO SIN12
RTP13   :   C -> A[W]
ADR9    :   B EXCHANGE C[W]
            C - 1 -> C[P]
            C -> DATA ADDRESS
            B EXCHANGE C[W]
            0 -> B[W]
            RETURN
RMOD2   :   A - 1 -> A[P]
            IF NO CARRY GO TO RMOD3
            C + 1 -> C[X]
            JSB LD90
            JSB MPY30
RMOD5   :   JSB PI20
            JSB DVD33
            GO TO RMOD6
```

| #   | Label    | Code           | Target    |
|-----|----------|----------------|-----------|
| 42  | L04052:  | .111.1..11     | -> L4164  |
| 43  | L04053:  | .111.1.111     | -> L4165  |
| 44  | L04054:  | .111.11.11     | -> L4166  |
| 45  | L04055:  | ..........     |           |
| 46  | L04056:  | .111.11111     | -> L4167  |
| 47  | L04057:  | 11.1111111     | -> L4337  |
| 48  | L04060:  | 1.1.11.1..     |           |
| 49  | L04061:  | .....1....     | -> L0062  |
| 50  | L04062:  | 1.1..1....     | -> L5063  |
| 51  | L04063:  | 1.1..1....     | -> L5064  |
| 52  | L04064:  | 1.1..1....     | -> L5065  |
| 53  | L04065:  | ..........     |           |
| 54  | L04066:  | 1.....1111     | -> L4203  |
| 55  | L04067:  | 1.....1111     | -> L4203  |
| 56  | L04070:  | ...11..11.     |           |
| 57  | L04071:  | .1.111.111     | -> L4135  |
| 58  | L04072:  | 1.....1111     | -> L4203  |
| 59  | L04073:  | 1.....1111     | -> L4203  |
| 60  | L04074:  | 1.....1111     | -> L4203  |
| 61  | L04075:  | .....1..1.1    | -> L4011  |
| 62  | L04076:  | 1.....1111     | -> L4203  |
| 63  | L04077:  | 11..1.11..     |           |
| 64  | L04100:  | .1..1.1.11     | -> L4112  |
| 65  | L04101:  | .....111.1     | -> L4007  |
| 66  | L04102:  | 1..1.1.1..     |           |
| 67  | L04103:  | 11....1.11     | -> L4302  |
| 68  | L04104:  | .1........     |           |
| 69  | L04105:  | .11111111.     |           |
| 70  | L04106:  | .11111111.     |           |
| 71  | L04107:  | ....11.1..     |           |
| 72  | L04110:  | 1.1....1..     |           |
| 73  | L04111:  | 1111111..1     | -> L4376  |
| 74  | L04112:  | 11.11.11..     |           |
| 75  | L04113:  | ...1111111     | -> L4037  |
| 76  | L04114:  | 11.1111.1.     |           |
| 77  | L04115:  | 1..1.1.111     | -> L4225  |
| 78  | L04116:  | ....1....1.1   | -> L4021  |
| 79  | L04117:  | ..........     |           |
| 80  | L04120:  | .1111...1.     |           |
| 81  | L04121:  | 1.....1.1..    |           |
| 82  | L04122:  | 11.1111111     | -> L4337  |
| 83  | L04123:  | ..1.1.1...     |           |
| 84  | L04124:  | ....11.1..     |           |
| 85  | L04125:  | 1......1..     |           |
| 86  | L04126:  | 1...111111     | -> L4217  |
| 87  | L04127:  | 1.111..1..     |           |
| 88  | L04130:  | 1.111.....     |           |
| 89  | L04131:  | 1.11.1.1..     |           |
| 90  | L04132:  | .1.11...11     | -> L4130  |
| 91  | L04133:  | 1.111.....     |           |
| 92  | L04134:  | ....11....     |           |
| 93  | L04135:  | ..11..11..     |           |
| 94  | L04136:  | .11.1...1.     |           |
| 95  | L04137:  | 1..11...11     | -> L4230  |
| 96  | L04140:  | .11.......     |           |
| 97  | L04141:  | .1.1.111.1     | -> L4127  |
| 98  | L04142:  | .11.......     |           |
| 99  | L04143:  | 1.1111.1.1     | -> L4275  |
| 100 | L04144:  | 111...1111     | -> L4343  |
| 101 | L04145:  | 1.11..11..     |           |
| 102 | L04146:  | ...11....1.    |           |
| 103 | L04147:  | 1.1.111111     | -> L4257  |
| 104 | L04150:  | 1.1...11..     |           |
| 105 | L04151:  | ....11...1.    |           |
| 106 | L04152:  | 1111...1.1     | -> L4360  |
| 107 | L04153:  | 1.1..1....     | -> L5154  |
| 108 | L04154:  | 1..1111111     | -> L4237  |
| 109 | L04155:  | .....111..     |           |
| 110 | L04156:  | .....111..     |           |
| 111 | L04157:  | .....111..     |           |
| 112 | L04160:  | .....111..     |           |
| 113 | L04161:  | .....111..     |           |
| 114 | L04162:  | ...11...11.    |           |
| 115 | L04163:  | .....111..     |           |
| 116 | L04164:  | .....111..     |           |
| 117 | L04165:  | .....111..     |           |

```
            RTN    :  GO TO P9
            LBL    :  GO TO P10
            GTO    :  GO TO P11
                      NO OPERATION
            DSP    :  GO TO FCN0
                      GO TO FCN8
ARTH4  :  DELAYED SELECT GROUP 1
*****                 SELECT ROM 0
*****       DIG9   :  SELECT ROM 5
*****       DIG8   :  SELECT ROM 5
*****       DIG7   :  SELECT ROM 5
                      NO OPERATION
            MNS    :  GO TO FCN19
            XLEY   :  GO TO FCN19
            CLX    :  IF C[M] >= 1
                        THEN GO TO CLR20
            EEX    :  GO TO FCN19
            CHS    :  GO TO FCN19
            LSTX   :  GO TO FCN19
            FCN25  :  JSB RUP
            ENTR   :  GO TO FCN19
            FCN11  :  IF P # 12
                        THEN GO TO FCN23
                      JSB XNEY
            UFCN4  :  IF S9 # 1
                        THEN GO TO UFCN5
                      MARK AND SEARCH
                      C + 1 -> C[S]
            UFCN7  :  C + 1 -> C[S]
                      CLEAR STATUS
                      1 -> S10
                      JSB UFCN6
            FCN23  :  IF P # 13
                        THEN GO TO FCN27
                      A - 1 -> A[XS]
                      IF NO CARRY GO TO FCN24
                      JSB EXCG
                      NO-OPERATION
            FCN7   :  C + 1 -> C[P]
                      IF S8 # 1
                        THEN GO TO FCN8
            FCN26  :  C EXCHANGE M
                      CLEAR STATUS
                      1 -> S8
                      GO TO RTN7
            MCIRC0 :  0 -> S11
            MCIRC1 :  0 -> F5
                      IF S11 # 1
                        THEN GO TO MCIRC1
                      0 -> F5
                      RETURN
            CLR20  :  3 -> P
                      IF C[P] = 0
                        THEN GO TO CLR23
                      MEMORY DELETE
                      JSB MCIRC0
            CLR21  :  MEMORY DELETE
                      JSB ARSTR2
                      GO TO FCN20
                      11 -> P
                      IF C[P] >= 1
                        THEN GO TO UFCN3
                      10 -> P
                      IF C[P] >= 1
                        THEN GO TO UFCN8
*****                 SELECT ROM 5
                      GO TO PAD2
            P3     :  P - 1 -> P
            P4     :  P - 1 -> P
            P5     :  P - 1 -> P
            P6     :  P - 1 -> P        .60,56,62
            P7     :  P - 1 -> P
                      0 -> C[M]
            P8     :  P - 1 -> P
            P9     :  P - 1 -> P
            P10    :  P - 1 -> P
```

```
118  L04166:  .....111..
119  L04167:  1...1.11..
120  L04170:  11...1.111  -> L4305
121  L04171:  1.11111..1  -> L4276
122  L04172:  1..1...1..
123  L04173:  11........
124  L04174:  ..11.1.1..
125  L04175:  ...1.....11 -> L4020
126  L04176:  111...1111  -> L4343
127  L04177:  1.1.1.11..
128  L04200:  1.111.1.11  -> L4272
129  L04201:  ...11..1.1  -> L4031
130  L04202:  111.1...11  -> L4350
131  L04203:  1.1111.1.1  -> L4275
132  L04204:  ..11.1.1..
133  L04205:  ....111111  -> L4017
134  L04206:  111...1.11  -> L4342
135  L04207:  ..........
136  L04210:  .1........
137  L04211:  ....11.1..
138  L04212:  1....1....
139  L04213:  .11111111.
140  L04214:  ..11...11.
141  L04215:  ..1.1.1...
142  L04216:  .1.1.111.1  -> L4127
143  L04217:  ..1...1....  -> L1220
144  L04220:  1..11.11..
145  L04221:  .1.1.....11 -> L4120
146  L04222:  ..11.1.1..
147  L04223:  1.1.....11  -> L4240
148  L04224:  11.1111111  -> L4337
149  L04225:  11.1111.1.
150  L04226:  ..1111.111  -> L4075
151  L04227:  ....11.1.1  -> L4015
152  L04230:  1..1.11.1..
153  L04231:  .1...1....  -> L2232
154  L04232:  ...1.1....
155  L04233:  11........
156  L04234:  .1.1.111.1  -> L4127
157  L04235:  11........
158  L04236:  .1.1.111.1  -> L4127
159  L04237:  .1....1...  -> L2240
160  L04240:  1....1.1..
161  L04241:  11.11.1.11  -> L4332
162  L04242:  .11.11111.
163  L04243:  1...1...11  -> L4210
164  L04244:  .1.111111.
165  L04245:  .11.11111.
166  L04246:  11.111..11  -> L4334
167  L04247:  1.1.11..11  -> L4254
168  L04250:  1.1.......
169  L04251:  .1.1.111.1  -> L4127
170  L04252:  111.1.....
171  L04253:  ...1..111.1 -> L4047
172  L04254:  1.1.......
173  L04255:  .1.1.111.1  -> L4127
174  L04256:  11.111..11  -> L4334
175  L04257:  1.1.......
176  L04260:  .1.1.111.1  -> L4127
177  L04261:  1111....11  -> L4360
178  L04262:  ..11.1.1..
179  L04263:  1.11.11.11  -> L4266
180  L04264:  .11.......
181  L04265:  .1.1.111.1  -> L4127
182  L04266:  111.1.....
183  L04267:  1...11.11.
184  L04270:  .111111111  -> L4177
185  L04271:  ..1.1..1.1  -> L4051
186  L04272:  1.111.11..
187  L04273:  ..11111111  -> L4077
188  L04274:  ..11.111.1  -> L4067
189  L04275:  ..11...11.
190  L04276:  ..1.1...1.
191  L04277:  1.11..111.
192  L04300:  .11..1111.
193  L04301:  .....11....
```

```
              P11   : P - 1 -> P
              FCN0  : IF P # 8
                         THEN GO TO FCN1
                      JSB ARSTR1
                      1 -> S9
                      POINTER ADVANCE
                      IF S3 # 1
                         THEN GO TO FCN2
                      GO TO FCN20
              FCN9  : IF P # 10
                         THEN GO TO FCN10
                      JSB XEQY
                      GO TO LBR1
              FCN19 : JSB ARSTR2
              FCN22 : IF S3 # 1
                         THEN GO TO FCN21
                      GO TO FCN13
                      NO OPERATION
              RTN2  : MARK AND SEARCH
                      CLEAR STATUS
                      1 -> S8
                      C + 1 -> C[S]
                      0 -> C[M]
                      C EXCHANGE M
                      JSB MCIRC0
*****         RTN7  : SELECT ROM 1
              FCN4  : IF P # 9    66,68
                         THEN GO TO FCN7
                      IF S3 # 1
                         THEN GO TO RTN0
                      GO TO FCN8
              FCN24 : A - 1 -> A[XS]
                      IF NO CARRY GO TO FCN25
                      JSB RDN
CLR23 : DELAYED SELECT GROUP 1
                      SELECT ROM 2
              PAD1  : 1 -> F1
              PAD0  : POINTER ADVANCE
                      JSB MCIRC0
              PAD3  : POINTER ADVANCE
                      JSB MCIRC0
*****         PAD2  : SELECT ROM 2
              RTN0  : IF S8 # 1
                         THEN GO TO RTN1
                      IF C[S] = 0
                         THEN GO TO RTN2
                      C - 1 -> C[S]
                      IF C[S] = 0
                         THEN GO TO RTN3
                      GO TO RTN6
              RTN5  : SEARCH FOR LABEL
                      JSB MCIRC0
                      1 -> F7
                      JSB RSETP
              RTN6  : SEARCH FOR LABEL
                      JSB MCIRC0
                      GO TO RTN3
              UFCN3 : SEARCH FOR LABEL
              UFCN9 : JSB MCIRC0
                      GO TO UFCN8
              FCN3  : IF S3 # 1
                         THEN GO TO FCN15
                      MEMORY DELETE
                      JSB MCIRC0
              FCN15 : 1 -> F7
                      IF P # 9
                         THEN GO TO FCN9
                      JSB XGTY
              FCN10 : IF P # 11
                         THEN GO TO FCN11
                      JSB XLEY
              ARSTR2: 0 -> C[M]
              ARSTR1: C EXCHANGE M
              ARSTR0: SHIFT RIGHT A[W]
                      C -> A[S]
                      RETURN
```

```
194  L04302:  1.1.......
195  L04303:  .1...11.11  -> L4106
196  L04304:  1..11.1111  -> L4233
197  L04305:  .11.1..11.
198  L04306:  1..1...11.  -> L4220
199  L04307:  .1.11..11.
200  L04310:  .11.1..11.
201  L04311:  1.11..1.11  -> L4262
202  L04312:  ..11...11.
203  L04313:  11111.....
204  L04314:  1..1....11  -> L4220
205  L04315:  ..11.1....
206  L04316:  .1.1..11..
207  L04317:  .11.1...1.
208  L04320:  ..11...11.  -> L4060
209  L04321:  ..11...11.
210  L04322:  .1....1.1.
211  L04323:  .1....1.1.
212  L04324:  .1111...1.
213  L04325:  .1111...1.
214  L04326:  11.1111.1.
215  L04327:  11.1.1.111  -> L4325
216  L04330:  ...1.1.1..
217  L04331:  1...111111  -> L4217
218  L04332:  1..1.1.1..
219  L04333:  1.1.1...11  -> L4250
220  L04334:  ..11.1.11.
221  L04335:  ..1.1.1...
222  L04336:  ...1..1....  -> L1337   *****
223  L04337:  1.11111..1  -> L4276
224  L04340:  ..11.1.1..
225  L04341:  1...111111  -> L4217
226  L04342:  ..1.......
227  L04343:  .1.1.111.1  -> L4127
228  L04344:  .11.1.....
229  L04345:  1...111111  -> L4217
230  L04346:  1.1111.1.1  -> L4275
231  L04347:  111...1.11  -> L4342
232  L04350:  ...1......
233  L04351:  .......11  -> L4000
234  L04352:  1.111.....
235  L04353:  .11.1..11.
236  L04354:  11111..111  -> L4371
237  L04355:  1.1...11..
238  L04356:  .11.1...1.
239  L04357:  1111.11.11  -> L4366
240  L04360:  ....11..11.
241  L04361:  ..1.1.1...
242  L04362:  ..1..1.111  -> L4045
243  L04363:  11111.11..
244  L04364:  11..1.1.11  -> L4312
245  L04365:  .........1  -> L4000
246  L04366:  1.11..11..
247  L04367:  ...11...1.
248  L04370:  1.1.111111  -> L4257
249  L04371:  ..11.1.11.
250  L04372:  1....1.1..
251  L04373:  .1....1.11  -> L4102
252  L04374:  .1........
253  L04375:  ......11.1.
254  L04376:  1....1..1..
255  L04377:  1.11....11  -> L4260

ROM05 OBJECT PROGRAM

0   L05000:  ..........
1   L05001:  1.11111111  -> L5277
2   L05002:  11111.1.1.
3   L05003:  11111.1.1.
4   L05004:  11111.1.1.
5   L05005:  ...1..1.11  -> L5044
6   L05006:  1....1.111  -> L5205
7   L05007:  111..1....  -> L7010   *****
8   L05010:  11.....1    -> L5360
9   L05011:  11.1..111
10  L05012:  1.11111...
```

```
UFCN5  :  SEARCH FOR LABEL
          GO TO UFCN7
          GO TO PAD0
FCN1   :  IF C[M] = 0       58,56
              THEN GO TO FCN4
          C - 1 -> C[M]
          IF C[M] = 0       64
              THEN GO TO FCN3
FCN6   :  0 -> C[M]
          0 -> F7
          GO TO FCN4
          KEYS -> ROM ADDRESS
          5 -> P
          IF C[P] = 0
              THEN GO TO ARTH4
          0 -> C[M]
          SHIFT LEFT A[X]
          SHIFT LEFT A[X]
          C + 1 -> C[P]
STO36  :  C + 1 -> C[P]
          A - 1 -> A[XS]
          IF NO CARRY GO TO STO36
          C EXCHANGE M
          GO TO RTN7
RTN1   :  IF S9 # 1
              THEN GO TO RTN5
RTN3   :  0 -> C[MS]
          C EXCHANGE M
          SELECT ROM 1
FCN8   :  JSB ARSTR1
FCN16  :  IF S3 # 1
              THEN GO TO RTN7   DISPLAY
FCN13  :  MEMORY INSERT
FCN20  :  JSB MCIRC8
FCN5   :  1 -> F3
          GO TO RTN7    DISPLAY
          JSB ARSTR2
          GO TO FCN13
LBR1   :  BUFFER -> ROM ADDRESS
          GO TO NOOP
UFCN0  :  0 -> F5
          IF C[M] = 0
              THEN GO TO UFCN1
          10 -> P
          IF C[P] = 0
              THEN GO TO UFCN2
UFCN8  :  0 -> C[M]
          C EXCHANGE M
          GO TO UFCN10
FCN28  :  IF P # 15
              THEN GO TO FCN6
          JSB NOOP
UFCN2  :  11 -> P
          IF C[P] >= 1
              THEN GO TO UFCN3
UFCN1  :  0 -> C[MS]
          IF S8 # 1
              THEN GO TO UFCN4
          MARK AND SEARCH
          CLEAR STATUS
UFCN6  :  1 -> S8
          GO TO UFCN9

DUMMY  :  NO OPERATION
ERR2   :  GO TO ERR1
DIG4   :  A + 1 -> A[X]
DIG3   :  A + 1 -> A[X]
DIG2   :  A + 1 -> A[X]
          IF NO CARRY GO TO DIG1
MPY    :  GO TO MPY1
FNL1   :  SELECT ROM 7     *****
XNEY   :  JSB SETRL2
          A - C -> A[W]
          DATA -> C
```

| | | | | | |
|---|---|---|---|---|---|
| 11 | L05013: | 1..11.111. | | | IF A[W] >= 1 |
| | | | | | THEN GO TO FRTN9 |
| 12 | L05014: | 11.1.11.11 | -> L5326 | | GO TO RL2 |
| 13 | L05015: | 11....1111 | -> L5303 | INX1 : | 0 -> A[W] |
| 14 | L05016: | 1.111.111. | | | A + 1 -> A[P] |
| 15 | L05017: | 11111...1. | | DIV2 : | 0 -> B[W] |
| 16 | L05020: | ....1.111. | -> L6022 ***** | FNL3 : | SELECT ROM 6 |
| 17 | L05021: | 11...1.... | | DIG7 : | A + 1 -> A[X] |
| 18 | L05022: | 11111.1.1. | | DIG6 : | A + 1 -> A[X] |
| 19 | L05023: | 11111.1.1. | | DIG5 : | A + 1 -> A[X] |
| 20 | L05024: | 11111.1.1. | | | IF NO CARRY GO TO DIG4 |
| 21 | L05025: | ......1.11 | -> L5002 | ADD1 : | GO TO ADD8 |
| 22 | L05026: | 1..11.1.11 | -> L5232 | FDGT5 : | A + 1 -> A[XS] |
| 23 | L05027: | 1111111.1. | | | IF NO CARRY GO TO FDGT6 |
| 24 | L05030: | 1..11...11 | -> L5230 | | GO TO TAN2 |
| 25 | L05031: | .1.1..1111 | -> L5123 | XEQY : | JSB SETRL2 |
| 26 | L05032: | 1111:....1 | -> L5360 | | A - C -> A[W] |
| 27 | L05033: | 11.1..111. | | | DATA -> C |
| 28 | L05034: | 1.11111... | | | IF A[W] >= 1 |
| 29 | L05035: | 1..11.111. | | | THEN GO TO RL2 |
| 30 | L05036: | 11....1111 | -> L5303 | | GO TO FRTN9 |
| 31 | L05037: | 11.1.11.11 | -> L5326 | FDGT3 : | A + 1 -> A[XS] |
| 32 | L05040: | 1111111.1. | | | IF NO CARRY GO TO FDGT4 |
| 33 | L05041: | .1.1....11 | -> L5120 | TAN1 : | 1 -> S1 |
| 34 | L05042: | ...1...1.. | | | GO TO SQT1 |
| 35 | L05043: | 1..1...111 | -> L5221 | DIG1 : | A + 1 -> A[X] |
| 36 | L05044: | 11111.1.1. | -> L5106 | | IF NO CARRY GO TO DIG10 |
| 37 | L05045: | .1...11.11 | -> L5106 | DIV1 : | GO TO MPY3 |
| 38 | L05046: | 1....11111 | -> L5207 | FIDGT4: | A + 1 -> A[XS] |
| 39 | L05047: | 1111111.1. | | | IF NO CARRY GO TO FIDGT5 |
| 40 | L05050: | .11..11.11 | -> L5146 | | GO TO COS1 |
| 41 | L05051: | .1.1..1.11 | -> L5122 | XGTY : | JSB SETRL0 |
| 42 | L05052: | 111.111..1 | -> L5356 | | 0 - C - 1 -> C[S] |
| 43 | L05053: | ..1111111. | | | JSB ADD3 |
| 44 | L05054: | 1..11.11.1 | -> L5233 | | DATA -> C |
| 45 | L05055: | 1.11111... | | | GO TO RL4 |
| 46 | L05056: | ..11....11 | -> L5060 | FNL2 : | SELECT ROM 3 |
| 47 | L05057: | .11..1.... | -> L3060 ***** | RL4 : | IF A[MS] >= 1 |
| 48 | L05060: | 1..111.11. | | | THEN GO TO RL5 |
| 49 | L05061: | ..1111.111 | -> L5075 | | GO TO RL2 |
| 50 | L05062: | 11....1111 | -> L5303 | DIG9 : | A + 1 -> A[X] |
| 51 | L05063: | 11111.1.1. | | DIG8 : | A + 1 -> A[X] |
| 52 | L05064: | 11111.1.1. | | | IF NO CARRY GO TO DIG7 |
| 53 | L05065: | ...1.1.11 | -> L5022 | SUB1 : | GO TO ADD2 |
| 54 | L05066: | 1..11..111 | -> L5231 | | GO TO FRAC1 |
| 55 | L05067: | 11...1.111 | -> L5305 | XLEY : | JSB SETRL0 |
| 56 | L05070: | 111.111..1 | -> L5356 | | A EXCHANGE C[W] |
| 57 | L05071: | 111.1.111. | | | 0 - C - 1 -> C[S] |
| 58 | L05072: | ..1111111. | | | JSB ADD3 |
| 59 | L05073: | 1..11.11.1 | -> L5233 | | DATA -> C |
| 60 | L05074: | 1.11111... | | RL5 : | A + 1 -> A[S] |
| 61 | L05075: | 111111111. | | | IF NO CARRY GO TO FRTN9 |
| 62 | L05076: | 11.1.11.11 | -> L5326 | | GO TO RL2 |
| 63 | L05077: | 11....1111 | -> L5303 | FDGT1 : | A + 1 -> A[XS] |
| 64 | L05100: | 1111111.1. | | | IF NO CARRY GO TO FDGT2 |
| 65 | L05101: | 1.11....11 | -> L5260 | LOG1 : | 1 -> S5 |
| 66 | L05102: | .1.1...1.. | | | GO TO LN1 |
| 67 | L05103: | 1.11..1.11 | -> L5262 | ##### SDGT7 : | DELAYED SELECT GROUP 1 |
| 68 | L05104: | 1.1.11.1.. | | ***** | SELECT ROM 1 |
| 69 | L05105: | ..1..1.... | -> L1106 | DIG10 : | IF C[M] = 0 |
| 70 | L05106: | .11.1..11. | | | THEN GO TO DIG11 |
| 71 | L05107: | 11.1111.11 | -> L5336 | | SELECT ROM 2 |
| 72 | L05110: | .1...1.... | -> L2111 ***** | DIG12 : | SELECT ROM 2 |
| 73 | L05111: | .1...1.... | -> L2112 ***** | FIDGT1: | A + 1 -> A[XS] |
| 74 | L05112: | 1111111.1. | | | IF NO CARRY GO TO FIDGT2 |
| 75 | L05113: | .1.11.1111 | -> L5133 | | SELECT ROM 0 |
| 76 | L05114: | .....1.... | -> L0115 ***** | GDGT15: | A - B -> A[XS] |
| 77 | L05115: | 11...11.1. | | | 13 -> P |
| 78 | L05116: | 11.1..11.. | | | GO TO GDGT12 |
| 79 | L05117: | 11.1...111 | -> L5310 | FDGT4 : | A + 1 -> A[XS] |
| 80 | L05120: | 1111111.1. | | | IF NO CARRY GO TO FDGT5 |
| 81 | L05121: | ...1.11111 | -> L5027 | COS1 : | 1 -> S9 |
| 82 | L05122: | 1..1...1.. | | TAN2 : | 1 -> S5 |
| 83 | L05123: | .1.1...1.. | | | GO TO TAN1 |
| 84 | L05124: | ..1...1.11 | -> L5042 | GDGT4 : | 0 -> C[M] |
| 85 | L05125: | ..11...11. | | | |

```
 86  L05126:  ..1.1.1...
 87  L05127:  .11.111.11  -> L5156
 88  L05130:  1.11.1.1.1  -> L5265
 89  L05131:  .11..1....  -> L3132
 90  L05132:  ..1.111111  -> L5057
 91  L05133:  1111111.1.
 92  L05134:  11..1.1.11  -> L5312
 93  L05135:  1.11..1111  -> L5263
 94  L05136:  11.1111.1.
 95  L05137:  11.1.1..11  -> L5324
 96  L05140:  .11.1.1...
 97  L05141:  .1..1.1...
 98  L05142:  111.1.111.
 99  L05143:  .11....1..
100  L05144:  ..1....1..
101  L05145:  .....11111  -> L5007
102  L05146:  1111111.1.
103  L05147:  .11.11.111  -> L5155
104  L05150:  .1.1..1111  -> L5123
105  L05151:  1.11.11..1  -> L5266
106  L05152:  ...1......
107  L05153:  ........11  -> L5000
108  L05154:  1...1.1111  -> L5213
109  L05155:  .11..1....  -> L3156
110  L05156:  ....1.111.
111  L05157:  11.1111.1.
112  L05160:  11.1..1.11  -> L5322
113  L05161:  ..111.....
114  L05162:  1.11.1.1..
115  L05163:  .111.1.111  -> L5165
116  L05164:  .1..1.1...
117  L05165:  11...1....  -> L6166
118  L05166:  11.1111.1.
119  L05167:  .1111.1.11  -> L5172
120  L05170:  111...11..
121  L05171:  11..1...11  -> L5310
122  L05172:  11.1111.1.
123  L05173:  111...1111  -> L5343
124  L05174:  11..11111.  -> L5307
125  L05175:  .11..11...
126  L05176:  .11.1...1.
127  L05177:  .1..1...11  -> L5104
128  L05200:  1.11.1.1.1  -> L5265
129  L05201:  1111111.1.
130  L05202:  .1..1.1.11  -> L5112
131  L05203:  .....1....  -> L0204
132  L05204:  1111111.11  -> L5376
133  L05205:  ..11..11..
134  L05206:  ..1.1.1.1.
135  L05207:  ..11.1.1...
136  L05210:  ...1....11  -> L5020
137  L05211:  111.1.1111  -> L5353
138  L05212:  1..11.1111  -> L5233
139  L05213:  .111..11..
140  L05214:  .11.1...1.
141  L05215:  .11111.111  -> L5175
142  L05216:  1.11.1.1.1  -> L5265
143  L05217:  1111111.1.
144  L05220:  .1......11  -> L5100
145  L05221:  ....1.111.
146  L05222:  ..1.1111.1  -> L5057
147  L05223:  .1....1.1.
148  L05224:  .1....1.1.
149  L05225:  ...11...1.
150  L05226:  .111.11.11  -> L5166
151  L05227:  .....1....  -> L0230
152  L05230:  ..11..1...  -> L3231
153  L05231:  ..1111111.
154  L05232:  .11.1.1...
155  L05233:  ....1.111.
156  L05234:  1111111.1.
157  L05235:  1111111.1.
158  L05236:  1111111.1.
159  L05237:  .111111.1.
160  L05240:  ...1.1.1..
161  L05241:  1.1...1111  -> L5243
162  L05242:  111.1.111.
```

```
                 C EXCHANGE M
                 GO TO GDGT17
                 JSB SAVX1
*****            SELECT ROM 3
                 GO TO FNL2
         FIDGT2: A + 1 -> A[XS]
                 IF NO CARRY GO TO FIDGT3
                 GO TO LOG2
         GDGT4 : A - 1 -> A[XS]
                 IF NO CARRY GO TO ABS0
                 STACK -> A
                 C -> STACK
                 A -EXCHANGE C[W]
         YTX1 :  1 -> S6
         YTX2 :  1 -> S2
                 GO TO FNL1
         FIDGT5: A + 1 -> A[XS]
                 IF NO CARRY GO TO FIDGT6
                 GO TO TAN2
                 JSB SAVX3
                 BUFFER -> ROM ADDRESS
                 GO TO DUMMY
                 GO TO SDGT5
*****    FIDGT6: SELECT ROM 3
         GDGT17: 0 -> B[W]
                 A - 1 -> A[XS]
                 IF NO CARRY GO TO GDGT20
                 0 -> F1
                 IF S11 # 1
                    THEN GO TO PI2
                 C -> STACK
*****    PI2   : SELECT ROM 6
         GDGT10: A - 1 -> A[XS]
                 IF NO CARRY GO TO GDGT11
                 14 -> P
                 GO TO GDGT12
         GDGT11: A - 1 -> A[XS]
                 IF NO CARRY GO TO GDGT13
                 GO TO GDGT14
         SDGT6 : 6 -> P
                 IF C[P] = 0
                    THEN GO TO SDGT7
                 JSB SAVX1
                 A + 1 -> A[XS]
                 IF NO CARRY GO TO FIDGT1
*****            SELECT ROM 0
                 GO TO STO34
         MPY1  : 3 -> P
                 0 - C -> C[X]
         MPY3  : STACK -> A
                 GO TO DIV2
                 GO TO GDGT16
                 GO TO ADD3
         SDGT5 : 7 -> P
                 IF C[P] = 0
                    THEN GO TO SDGT6
                 JSB SAVX1
                 A + 1 -> A[XS]
                 IF NO CARRY GO TO FDGT1
         SQT1  : 0 -> B[W]
                 JSB FNL2
         SDGT0 : SHIFT LEFT A[X]
                 SHIFT LEFT A[X]
                 IF C[P] >= 1
                    THEN GO TO GDGT10
*****            SELECT ROM 0
*****    FDGT6 : SELECT ROM 3
         ADD2  : 0 - C - 1 -> C[S]
         ADD8  : STACK -> A
         ADD3  : 0 -> B[W]
                 A + 1 -> A[XS]
                 A + 1 -> A[XS]
                 C + 1 -> C[XS]
                 C + 1 -> C[XS]
                 IF A >= C[X]
                    THEN GO TO ADD4
                 A -EXCHANGE C[W]
```

| # | Label | Code | Jump |
|---|---|---|---|
| 163 | L05243: | 111.1..11. | |
| 164 | L05244: | .11.1..11. | |
| 165 | L05245: | 1.1..11111 | -> L5247 |
| 166 | L05246: | 111.1.111. | |
| 167 | L05247: | 1...1..11. | |
| 168 | L05250: | ...1..1.1. | |
| 169 | L05251: | 1.11111.11 | -> L5276 |
| 170 | L05252: | 1.1...111. | |
| 171 | L05253: | 11111.1.1. | |
| 172 | L05254: | ......111. | |
| 173 | L05255: | 1.11111.11 | -> L5276 |
| 174 | L05256: | 1.1.1...11 | -> L5250 |
| 175 | L05257: | .......... | |
| 176 | L05260: | 1111111.1. | |
| 177 | L05261: | ..1.....11 | -> L5040 |
| 178 | L05262: | .11.....1.. | |
| 179 | L05263: | 1..1....1.. | |
| 180 | L05264: | .11..1..11 | -> L5144 |
| 181 | L05265: | ..11...11. | |
| 182 | L05266: | ...1.1.1... | |
| 183 | L05267: | ....1.111. | |
| 184 | L05270: | 1...1.111. | |
| 185 | L05271: | 1..111.... | |
| 186 | L05272: | 1...1.111. | |
| 187 | L05273: | 1.1111.... | |
| 188 | L05274: | 11....11.. | |
| 189 | L05275: | ....11.... | |
| 190 | L05276: | 11...1.... | -> L6277 |
| 191 | L05277: | ....11.1.. | |
| 192 | L05300: | ..11..111. | |
| 193 | L05301: | .1.1....1. | |
| 194 | L05302: | 11..111111 | -> L5317 |
| 195 | L05303: | 1.....1.... | -> L4304 |
| 196 | L05304: | ......1.... | -> L0305 |
| 197 | L05305: | 1.11.1.1.1 | -> L5265 |
| 198 | L05306: | .11...1... | -> L3307 |
| 199 | L05307: | 1111..11.. | |
| 200 | L05310: | 1....1.... | -> L4311 |
| 201 | L05311: | 11.11...11 | -> L5330 |
| 202 | L05312: | .111...1.. | |
| 203 | L05313: | 1111111.1. | |
| 204 | L05314: | ..1..11111 | -> L5047 |
| 205 | L05315: | ..1...1.11 | -> L5042 |
| 206 | L05316: | 1....1.... | -> L4317 |
| 207 | L05317: | .1...1.... | -> L2320 |
| 208 | L05320: | 1..11.1111 | -> L5233 |
| 209 | L05321: | 1111111.11 | -> L5376 |
| 210 | L05322: | 1.11..111. | -> L5267 |
| 211 | L05323: | 11...1..11 | -> L5304 |
| 212 | L05324: | ..11.1111. | |
| 213 | L05325: | .1...1.... | -> L2326 |
| 214 | L05326: | .1...1.... | -> L2327 |
| 215 | L05327: | .1...1.... | -> L2330 |
| 216 | L05330: | 11.1111.1. | |
| 217 | L05331: | .1.1111.11 | -> L5136 |
| 218 | L05332: | ....111.11 | -> L5016 |
| 219 | L05333: | .1...1.1.. | |
| 220 | L05334: | 11.1.1.111 | -> L5325 |
| 221 | L05335: | ....11.... | |
| 222 | L05336: | ..1.1.1... | |
| 223 | L05337: | ..11.1.1.. | |
| 224 | L05340: | .1..1..111 | -> L5111 |
| 225 | L05341: | 1...1..... | -> L4342 |
| 226 | L05342: | .......... | |
| 227 | L05343: | ..1...11.. | |
| 228 | L05344: | 1...1.111. | |
| 229 | L05345: | .1.1.11... | |
| 230 | L05346: | 1...1.111. | |
| 231 | L05347: | 1....11.1. | |
| 232 | L05350: | .1..11.111 | -> L5115 |
| 233 | L05351: | ..11.1.1.. | |
| 234 | L05352: | .1.1.1.111 | -> L5125 |
| 235 | L05353: | ..11...11. | |
| 236 | L05354: | ..1.1.1... | |
| 237 | L05355: | 111....111 | -> L5341 |
| 238 | L05356: | ....11.1.. | |
| 239 | L05357: | ..1..1.1.. | |
| 240 | L05360: | ..1.1.1... | |

```
ADD4   : A EXCHANGE C[M]
         IF C[M] = 0
            THEN GO TO ADD5
         A EXCHANGE C[M]
ADD5   : B EXCHANGE C[M]
ADD6   : IF A >= C[X]
            THEN GO TO ADD7
         SHIFT RIGHT B[W]
         A + 1 -> A[X]
         IF B[W] = 0
            THEN GO TO ADD7
         GO TO ADD6
         NO OPERATION
FDGT2  : A + 1 -> A[XS]
         IF NO CARRY GO TO FDGT3
LN1    : 1 -> S6
LOG2   : 1 -> S9
         GO TO YTX2
SAVX1  : 0 -> C[M]
SAVX3  : C EXCHANGE M
SAVX2  : 0 -> B[W]
         B EXCHANGE C[W]
         C -> DATA ADDRESS
         B EXCHANGE C[W]
         C -> DATA
         12 -> P
         RETURN
ADD7   : SELECT ROM 6
ERR1   : CLEAR STATUS
         0 -> C[W]
         1 -> S5
         GO TO ERR3
RL2    : SELECT ROM 4
GDGT2  : SELECT ROM 0
FRAC1  : JSB SAVX1
         SELECT ROM 3
GDGT14 : 15 -> P
GDGT12 : SELECT ROM 4
         GO TO GDGT3
FIDGT3 : 1 -> S7
         A + 1 -> A[XS]
         IF NO CARRY GO TO FIDGT4
         GO TO TAN1
SDGT8  : SELECT ROM 4
ERR3   : SELECT ROM 2
         GO TO ADD3
         GO TO STO34
GDGT20 : JSB SAVX2
         GO TO GDGT2
ABS0   : 0 -> C[S]
FRTN8  : SELECT ROM 2
FRTN9  : SELECT ROM 2
FRTN10 : SELECT ROM 2
GDGT3  : A - 1 -> A[XS]
         IF NO CARRY GO TO GDGT4
         GO TO INX1
         IF S4 # 1
            THEN GO TO FRTN8
         RETURN
DIG11  : C EXCHANGE M
         IF S3 # 1
            THEN GO TO DIG12
DIG13  : SELECT ROM 4
         NO OPERATION
GDGT13 : 2 -> P
         B EXCHANGE C[W]
         LOAD CONSTANT 5
         B EXCHANGE C[W]
         IF A >= B[XS]
            THEN GO TO GDGT15
         IF S3 # 1
            THEN GO TO GDGT1
GDGT16 : 0 -> C[M]
         C EXCHANGE M
         GO TO DIG13
SETRL0 : 0 -> S1
         0 -> S2
SETRL2 : C EXCHANGE M
```

```
241  L05361:  ....1.111.
242  L05362:  1...1.111.
243  L05363:  .1.111111.
244  L05364:  1..1..111.
245  L05365:  1..111....
246  L05366:  ..1...111.
247  L05367:  .11.1.1...
248  L05370:  1.1111....
249  L05371:  111.1.111.
250  L05372:  .1..1.1...
251  L05373:  .1.....1..
252  L05374:  ....11....
253  L05375:  1..11.11.1  -> L5233
254  L05376:  111...11..
255  L05377:  11.1.1.111  -> L5325
```

```
         0 -> B[W]
         B EXCHANGE C[W]
         C - 1 -> C[S]
         SHIFT RIGHT C[W]
         C -> DATA ADDRESS
         B -> C[W]
         STACK -> A
         C -> DATA
SETRL1:  A EXCHANGE C[W]
         C -> STACK
         1 -> S4
         RETURN
ST033 :  JSB ADD3
ST034 :  14 -> P
         GO TO FRTN8
```

We claim:

1. An electronic calculator comprising:
   a keyboard having a plurality of keys for entering information into the calculator;
   encoder means connected to the keyboard for generating key codes corresponding to the keys on the keyboard, each key code having a predetermined length and being generated in response to a particular key being depressed; and
   processing means connected to the encoder means for processing key codes, for producing a merged key code in response to receipt of a first selected key code followed by one of a plurality of second key codes, the merged key code having a length shorter than the combined lengths of the first selected key code and the one of the plurality of second key codes, and for substituting the merged key code for the first selected key code and the one of the plurality of second key codes.

2. An electronic calculator as in claim 1 including a program storage memory connected to the encoder means and the processing means for storing a program of processing steps in the form of a series of key codes, wherein the processing means produces the merged key code upon receipt of the one of the plurality of second key codes and inserts the merged key code, instead of the first selected key code and the one of the plurality of second key codes, into the program storage memory.

3. An electronic calculator as in claim 2 wherein the key codes have a fixed length and the merged key code has the same fixed length.

4. An electronic calculator as in claim 3 wherein the processing means includes:
   a status register connected to the encoding means for storing an indication of the generation of the first selected key code;
   a first comparator connected to the status register and the encoder means for generating an output signal when the first selected key code has been generated;
   a second comparator connected to the first comparator and the encoder means for generating an output signal in response to generation of the one of the plurality of second key codes and the output signal to the first comparator; and
   code generating means connected to the second comparator and the program storage memory for generating the merged key code in response to the output signal of the second comparator and for inserting the merged key code into the program storage memory.

5. An electronic calculator as in claim 1 wherein the key codes have a fixed length and the merged key code has the same fixed length.

6. An electronic calculator comprising:
   a keyboard having a plurality of keys for entering information into the calculator;
   encoder means connected to the keyboard for generating key codes corresponding to keys on the keyboard, each key code having a predetermined length and being generated in response to a particular key being depressed;
   a memory connected to the encoder means for storing key codes; and
   processing means connected to the encoder means and the memory for processing key codes, for producing a merged key code in response to receipt of a first selected key code followed by one of a plurality of second key codes, the merged key code having a length shorter than the combined lengths of the first selected key code and the one of the plurality of second key codes, and for inserting the merged key code into the memory.

7. An electronic calculator as in claim 6 wherein the key codes have a fixed length and the merged key code has the same fixed length.

8. An electronic calculator as in claim 6 wherein the processing means includes:
   a status register connected to the encoding means for storing an indication of the generation of the first selected key code;
   comparator means connected to the encoder means and the status register for generating an output signal when the one of the plurality of second key codes has been generated; and
   code generating means connected to the comparator means and the memory for generating the merged key code in response to the output signal of the comparator means and for inserting the merged key code into the memory.

* * * * *

UNITED STATES PATENT AND TRADEMARK OFFICE
CERTIFICATE OF CORRECTION

PATENT NO. : 4,099,246
DATED : July 4, 1978
INVENTOR(S) : Thomas E. Osborne and Richard Kent Stockwell It is certified that error appears in the above—identified patent and that said Letters Patent are hereby corrected as shown below:

Column 2, line 60, "1971" should read -- 1972 --;

Column 34, last line, "XGTY    :   GO TO FCN19" should read
-- XGTY    :   GO TO FCN19 --.

Signed and Sealed this

*Twenty-fifth* Day of *January 1983*

[SEAL]

Attest:

GERALD J. MOSSINGHOFF

*Attesting Officer*  *Commissioner of Patents and Trademarks*